(12) United States Patent
Furuyama et al.

(10) Patent No.: US 7,411,282 B2
(45) Date of Patent: Aug. 12, 2008

(54) LSI PACKAGE PROVIDED WITH INTERFACE MODULE, AND TRANSMISSION LINE HEADER EMPLOYED IN THE PACKAGE

(75) Inventors: Hideto Furuyama, Yokohama (JP); Hiroshi Hamasaki, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 11/081,617

(22) Filed: Mar. 17, 2005

(65) Prior Publication Data
US 2005/0230795 A1    Oct. 20, 2005

(30) Foreign Application Priority Data
Mar. 30, 2004    (JP)    ............... 2004-100734

(51) Int. Cl.
*H01L 23/02*    (2006.01)
(52) U.S. Cl. ...................... 257/678; 257/723
(58) Field of Classification Search ................ 257/723, 257/678, 698
See application file for complete search history.

(56) References Cited

U.S. PATENT DOCUMENTS

| 6,906,407 | B2 * | 6/2005 | Byers et al. ............ 257/686 |
| 2005/0230795 | A1 | 10/2005 | Furuyama et al. |

FOREIGN PATENT DOCUMENTS

| JP | 7-22594 | 4/1995 |
| JP | 2000-183370 | 6/2000 |
| JP | 2001-91174 | 4/2001 |
| JP | 2001-313438 | 11/2001 |
| JP | 2001-318283 | 11/2001 |
| JP | 2004-87790 | 3/2004 |

OTHER PUBLICATIONS

U.S. Appl. No. 11/204,168, filed Aug. 16, 2005, Furuyama et al.
U.S. Appl. No. 11/203,959, filed Aug. 16, 2006, Hamasaki et al.
U.S. Appl. No. 11/233,175, filed Sep. 23, 2005, Furuyama et al.
U.S. Appl. No. 11/442,276, filed May 30, 2006, Hamasaki et al.
U.S. Appl. No. 11/472,367, filed Jun. 22, 2006, Hamasaki et al.
U.S. Appl. No. 11/496,446, filed Aug. 1, 2006, Furuyama et al.
U.S. Appl. No. 11/531,922, filed Sep. 14, 2006, Hamasaki et al.

* cited by examiner

*Primary Examiner*—Roy Potter
(74) *Attorney, Agent, or Firm*—Oblon, Spivak, McClelland, Maier & Neustadt, P.C.

(57) ABSTRACT

An LSI package encompasses a transmission line header embracing a header-base, a transmission line held by the header-base, and an interface IC chip mounted on the header-base, an interposer substrate having a plurality of board-connecting joints, which facilitate connection with the printed wiring board; an LSI chip mounted on the interposer substrate; and a receptacle having a lead terminal and being mounted on the interposer substrate, configured to accommodate the transmission line header so that the interface IC chip electrically connects to the LSI chip through the lead terminal.

20 Claims, 16 Drawing Sheets

LSI PACKAGE PROVIDED WITH INTERFACE MODULE, AND TRANSMISSION LINE HEADER EMPLOYED IN THE PACKAGE

CROSS REFERENCE TO RELATED APPLICATIONS AND INCORPORATION BY REFERENCE

This application is based upon and claims the benefit of priority from prior Japanese Patent Application P2004-100734 filed on Mar. 30, 2004; the entire contents of which are incorporated by reference herein.

BACKGROUND OF THE INVENTION

1. Field of the Invention

The present invention relates to an LSI package provided with an interface (I/F) module, an interposer and an I/F module which are used in the LSI package, and a transmission line header implementing the I/F module.

2. Description of the Related Art

With improvements in the performance of electrically interconnected devices such as bipolar transistors and field-effect transistors, remarkable developments in the operation speed is being attempted in large scale integrated circuits for signal processing (hereinafter described "signal processing LSI"). However, the operation speed on a printed circuit board level mounting the signal processing LSI is still lower than the operation speed inside the signal processing LSI, although the inside operation speed of the signal processing LSI is inherently high, and further, on a rack level packaging hierarchy implemented by the printed circuit boards, the operation speed becomes further lower. The above-mentioned operation speed problems are caused by increases in transmission loss, noise, and electromagnetic interference associated with the electrical interconnections, which increase as the operation frequency becomes higher. Namely, it is inevitable that as the wiring length becomes long, the operating frequency becomes lower so as to ensure the signal quality. Therefore, such a tendency that the packaging technology limits the operation speed of the system rather than the operation speed of the signal processing LSI, has become more and more significant recently in the electrically interconnected device.

Taking such problems in electrically interconnected devices into consideration, optically interconnected devices configured to establish communications between signal processing LSIs by optical interconnection are proposed. In the optical interconnection, since the frequency dependence on losses, the electromagnetic interference in the distribution lines and noise associated with ground potential fluctuation can be ignored in a frequency range from direct current to a high frequency band over 100 GHz, communication of Gbps can be easily realized. Such an optically interconnected device establishing communications between signal processing LSIs by optical interconnection is disclosed, for instance, in NIKKEI ELECTRONICS, No. 810, pp 121-122, Dec. 3, 2001, in which a structure directly mounting an I/F module, which is adapted for external connection of high-speed signals, on an interposer which has a signal processing LSI, is proposed.

In the above-mentioned earlier technology, it is difficult to carry out board mounting of an interposer in an actual interposer mounting process, since the board mounting of an interposer is carried out under the condition where an interposer is mingled with an I/F module.

For instance, since the I/F module has an optical transmission line such as an optical fiber, etc, it is not possible to give heat treatment by putting the optical fiber into a solder reflow furnace of the interposer as it is. The problem is not limited to a case in which the optical transmission line is employed, since the same problem arises when an electrical transmission line such as a small coaxial cable is used for the transmission line.

Then, such methodology in which the optical transmission line is formed so that it can be detached from the I/F module by a detachable optical connector may be considered as disclosed in NIKKEI ELECTRONICS. However, in the detachable optical connector methodology, protectors for protecting optical semiconductor elements and optical connectors from mechanical damage and pollution are required. And, in addition, various architectures for lowering the process temperature so as to prevent thermal deformation of joints of the optical connector and for shortening the processing time are required. Because of these requirements, there was a problem being that the mounting condition of other parts which are supposed to be mounted on the same board do not meet with the mounting condition of the I/F module and that existing board assembly equipment was not able to be applied to as they were. Furthermore, the configuration becomes more and more complicated because pressure mechanism and holding mechanism of the optical connector must be provided in the detachable optical connector methodology, and therefore, the manufacturing cost drastically increases.

SUMMARY OF THE INVENTION

In view of these situations, it is an object of the present invention to provide an LSI package which can be manufactured through the existing production line and is not accompanied by an extremely complicated configuration, with high frequency characteristics and to provide an LSI package which implements part of the above-mentioned LSI package and a transmission line header which implements part of the above-mentioned LSI package.

An aspect of present invention may inhere in an LSI package mountable on a printed wiring board, encompassing (a) a transmission line header encompassing a header-base, a transmission line held by the header-base, and an interface IC chip mounted on the header-base; (b) an interposer substrate having a plurality of board-connecting joints, which facilitate connection with the printed wiring board; (c) an LSI chip mounted on the interposer substrate; and (d) a receptacle having a lead terminal and being mounted on the interposer substrate, configured to accommodate the transmission line header so that the interface IC chip electrically connects to the LSI chip through the lead terminal.

Another aspect of present invention may inhere in an intermediate package mountable on a printed wiring board, adapted for accommodating a transmission line header, which holds a transmission line and an interface IC chip, encompassing (a) an interposer substrate defined by a first main surface and a second main surface being opposite to the first main surface, having a plurality of board-connecting joints at the second main surface, which facilitate connection with the printed wiling board; (b) an LSI chip mounted on a mount-area assigned in the first main surface; and (c) a receptacle having a lead terminal and being mounted on the interposer substrate, configured to accommodate the transmission line header so that the interface IC chip electrically connects to the LSI chip through the lead terminal.

Still another aspect of present invention may inhere in a transmission line header configured to be inserted in to a receptacle, encompassing (a) a header-base; (b) an interface IC chip mounted on chip-mounting face assigned on the header-base; and (c) a transmission line held by the header-base, wherein thermal energy generated in the interface IC chip is transported away through the receptacle or an opening provided in the receptacle.

DETAILED DESCRIPTION OF THE INVENTION

Figure 1:
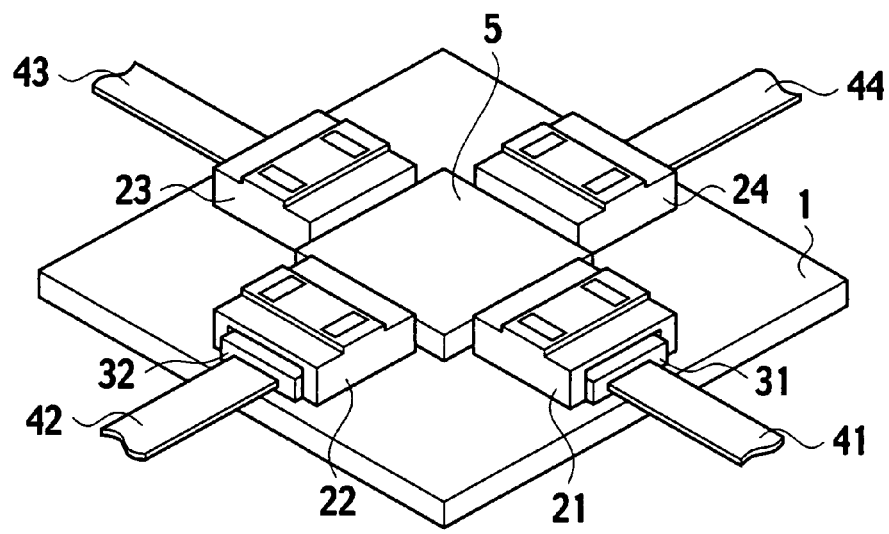
FIG. 1 is a schematic bird's-eye view illustrating a configuration of an LSI package provided with an I/F module according to a first embodiment of the present invention.

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers.

Before explaining various embodiments of the present invention, "an LSI package provided with an I/F module" proposed by inventors of the present invention in U.S. patent application Ser. No. 10/778,030, filed Feb. 17, 2004, the entire contents of which are incorporated by reference herein, will be explained by referring to FIG. 23. The LSI package includes an interposer substrate 1, an LSI chip 5 which is mounted on a top surface of the interposer substrate 1 and connecting pads 3a and 3b. A bottom surface of the interposer substrate 1 is connected to a printed wiring board, an illustration of which is omitted, by board-connecting joints (solder balls) 9a, 9b, 9c, . . . , 9r. And on an upper part of the LSI chip 5, a bottom surface of a heat sink (heat radiator) 3 is attached. Circuit boards 18a and 18b are arranged so that the circuit boards 18a and 18b can surround the LSI chip 5 on the bottom surface of the heat sink 3. Although the circuit boards 18a and 18b are shown separately, the circuit boards 18a and 18b can be used as integrated members so as to surround the LSI chip 5 in an architrave configuration. Further, a driving IC 61a is mounted on the circuit board 18a on the bottom surface of the heat sink 3 and is connected to an electrical to optical (EO) or optical to electrical (OE) converters 62a which is driven by the driving IC 61a. Similarly, a driving IC 61b is mounted on the circuit board 18b on the bottom surface of the heat sink 3 and is connected to an EO/OE converters 62b which is driven by the driving IC 61b.

The EO/OE converters 62a and 62b embrace the structure in which a plurality of semiconductor lasers and photo-detectors, etc. are integrated in a semiconductor chip by using the semiconductor lasers and the photo-detectors as active regions. Although detailed illustrations on surface interconnections, etc. of the EO/OE converters 62a and 62b are omitted, patterns of electrode wirings are drawn from the EO/OE converters 62a and 62b so as to facilitate electrical connection between the EO/OE converters 62a and 62b and the driving IC 61a and 61b. The driving IC 61a and 61b can be built-in or integrated monolithically in the same chip of the EO/OE converters 62a and 62b. And the EO/OE converters 62a and 62b are facing to the end face of each of the opposing optical fibers 64a and 64b so that the active regions of the EO/OE converters 62a and 62b are aligned opposing to the end face of each of the opposing optical fibers 64a and 64b with high-precise positioning technology, so as to optically couple with each of the optical fibers 64a and 64b. The optical fibers 64a and 64b are used for external interconnections of a high-speed I/F module, which is implemented by the circuit boards 18a and 18b, the driving ICs 61a and 61b and the EO/OE converters 62a and 62b.

High-speed signals from the LSI chip 5 are not supplied to the printed wiring board side, which is disposed at the bottom surface of the interposer substrate 1, through the solder balls 9a, 9b, 9c, . . . , 9r, but supplied to the driving ICs 61a and 61b through the connecting pads 3a, 3b and the circuit boards 18a, 18b which are disposed on the upper part of the interposer substrate 1. Then, the electric signals are converted into optical signals by the EO/OE converters 62a, 62b and are given to the optical fiber bundles 64a, 64b.

Here, "interposer substrate" is an element in an IC package, which connects a semiconductor chip to a motherboard, etc. The package substrate may be implemented by lead frames, TAB tapes, resin substrates, etc. Since the heat sink 3 and a cooling fan 4 are attached on to the upper part of the LSI chip 5, heat radiation of the LSI chip 5 is established.

Figure 23:
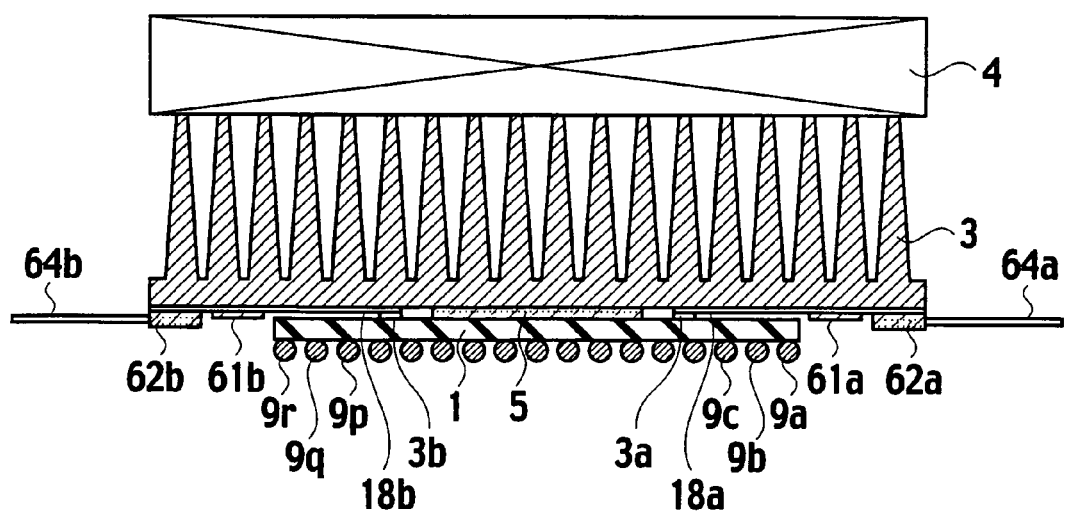
FIG. 23 is a schematic cross-sectional view showing the electrical connections between an interposer and an I/F module in an LSI package provided with an I/F module, which was described in U.S. patent application Ser. No. 10/778,030

The LSI package having such a configuration as shown in FIG. 23, can be assembled in completely the same procedure and condition as those of standard LSI packaging processes, which are carried out by existing packaging equipment (the reflow furnace, etc.), on the printed wiring board manufactured by existing production lines. And only the process for fixing the I/F module, which includes the circuit board 18a, 18b, the driving ICs 61a, 61b, and the EO/OE converters 62a, 62b, to the interposer substrate from the top of the printed wiring board—for instance, by screw or adhesive—becomes the characteristic work process for assembling the LSI package shown in FIG. 23. However, since the process for fixing the I/F module to the interposer substrate is by putting the I/F module on top of the interposer substrate, the architecture does not need a high-precise position controlling technology (for instance, ±10 μm). That is, such position controlling accuracy for a general electrical connector is enough for the process for fixing the I/F module to the interposer substrate, and the cost of the assembly process of the LSI package shown in FIG. 23 does not increase very much. Namely, even with the existing packaging method using existing low cost printed wiring boards (for instance, glass epoxy board, etc.), high-speed interconnections—for instance, 20 Gbps, which generally can not be realized in usual board electrical interconnection—becomes possible.

Although the LSI package provided with the I/F module shown in FIG. 23 has such an advantage in that heat radiation of each chip can be established easily because the signal processing LSI chip 5 and the driving ICs 61a, 61b are arranged two-dimensionally, the LSI package has a disadvantage in that analogue electrical wirings from optical semiconductor elements, illustrations of which are omitted, of the EO/OE converters 62a, 62b to the driving ICs 61a, 61b become too long, which may interrupt high-speed signal processing. Further the LSI package provided with the I/F module needs the circuit boards 18a, 18b which implement a supporting body for the I/F module, and it is preferable that the cost of sub-assembling the circuit boards 18a, 18b be saved, if possible.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The following first to fourth embodiments of the present invention provide an LSI package provided with the I/F module, in which an interface IC is merged with transmission lines, a sub-assembly package of the LSI package which implements part of the LSI package and a transmission line header which implements part of the LSI package, so that a connecting interval between the interface I/C and optical semiconductor elements, alternatively a connecting interval between the interface I/C and the transmission lines, can be made shorter, and further that a sub-substrate (supporting substrate) for an I/F module and the sub-assembly process of the I/F module can be eliminated.

For instance, though in the description of the first to fourth embodiments, an example using an optical interconnection is shown as an external interconnection of the high-speed I/F module, an electrical interconnection such as a small coaxial cable array may be acceptable for the external interconnection. In the case where an external interconnection is an electrical interconnection, high-speed wiring interface IC such as a line driver IC and a line receiver IC can be mounted instead of the driving IC and the optical element, and if necessary, a pre-emphasis circuit and an equalizer, etc. may be contained.

Generally and as it is conventional in the representation of semiconductor packages, it will be appreciated that the various drawings are not drawn to scale from one figure to another nor inside a given figure, and in particular that the layer thicknesses are arbitrarily drawn for facilitating the reading of the drawings.

First Embodiment

As shown in FIG. 1, the LSI package according to the first embodiment of the present invention includes a signal processing LSI chip (hereinafter called "an LSI chip") 5, and an interposer substrate 1, on which the LSI chip 5 is mounted, configured to be electrically connected to a printed wiring board, and a plurality of receptacles (socket receptacles) 21, 22, 23, 24, which are mounted on the interposer substrate 1. Each of the receptacles 21, 22, 23, 24 implements part of an interface mechanism between signals from/to the LSI chip 5 and signals from/to external transmission lines.

Figure 2:
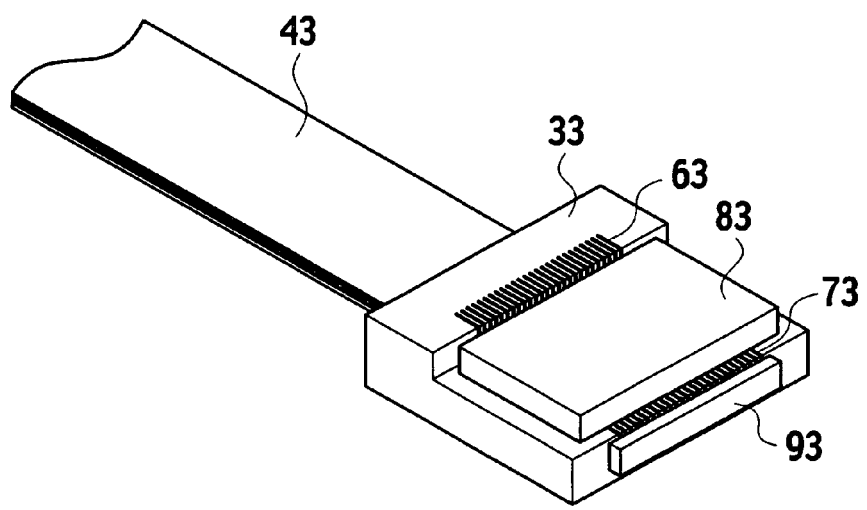
FIG. 2 is a schematic bird's-eye, view illustrating a configuration of the transmission line header employed in the LSI package shown in FIG. 1, illustrating a configuration in which the interface IC chip is mounted on the transmission line header.

The LSI package according to the first embodiment of the present invention further includes a plurality of transmission line headers implemented by the header-bodies 31, 32, . . . , each of which is configured to be inserted in corresponding receptacles 21, 22, 23, 24, respectively. On each of the header-bodies 31, 32, . . . an interface IC chip 83 is mounted so as to implement the transmission line header as shown in FIG. 2. The interface IC chip 83 implements part of the interface mechanism. Each of the header-bodies 31, 32, . . . establishes thermal flow from the interface IC chip 83 to the corresponding receptacles 21, 22, 23, 24.

The geometry of the interposer substrate 1 is defined by a first main surface (a top surface) and a second main surface (a bottom surface) being opposite to the first main surface. The LSI chip 5 is mounted on a mount-area assigned on the first main surface (top surface) of the interposer substrate 1. A plurality of board-connecting joints (electrical contact region) for facilitating connection with the printed wiring board (the illustration is omitted) are arranged on the second main surface (a bottom surface). Each of the header-bodies 31, 32, . . . is inserted in to the insides of the receptacles 21, 22, 23, 24 so that each can be detached from the receptacles 21, 22, 23, 24. In the inserted configuration, each of the header-bodies 31, 32, . . . is electrically connected to the LSI chip 5 through the receptacles 21, 22, 23, 24. The first pair of the transmission line header implemented by the first header-base 31 and the first receptacle 21, the second pair of the second transmission line header implemented by the second header-base 32 and the second receptacle 22, the third pair of the third transmission line header implemented by the third header-base (not shown) and the third receptacle 23, the fourth pair of the fourth transmission line header implemented by the fourth header-base (not shown) and the fourth receptacle 24 are called "interface modules (I/F modules)", respectively.

Although in FIG. 1, only two header-bodies 31 and 32 are shown, FIG. 1 inherently represents a configuration in which four transmission line headers are inserted to four receptacles 21, 22, 23 and 24, respectively. The first to fourth transmission line headers correspond to the I/F modules shown in FIG. 23, respectively. Although an illustration is omitted, each of the transmission line header embraces an optical semiconductor element (which will be described later) serving as an EO/OE converter and an interface IC (which will be described later), serving as a driving IC. Four header-bodies 31, 32, . . . are connected to corresponding ends of four transmission lines 41, 42, 43 and 44 respectively. In FIG. 1, parallel fiber-ribbon cables of twelve cores (optical fiber arrays of a taped configuration) are illustrated as aligned bundles of the transmission lines 41, 42, 43 and 44. For instance, a general quartz-based optical fiber is usable for each of the transmission lines in the aligned bundle 41, 42, 43 and 44. Specifically, a plurality of multi-mode optical fibers (MMFs), each having a core diameter of 50 μm and a cladding layer diameter of 125 μm can be deployed in an 250 μm array pitch of a central line for each of the aligned bundles of transmission lines 41, 42, 43 and 44. Also, an array of plastic optical fibers (POFs), each having a core diameter of 980 μm and a cladding layer diameter of 1000 μm, may be acceptable for the aligned bundles of transmission lines 41, 42, 43 and 44. Though illustrations are omitted, each of the aligned bundles of transmission lines 41, 42, 43 and 44 can be connected to optical connectors for connecting with the outside aligned bundle of transmission lines (parallel fiber-ribbon cable). The aligned bundles of transmission lines 41, 42, 43 and 44 can be implemented by not only optical fibers but also optical waveguide films formed of UV hardened epoxy resin, polyimide resin, or fluorocarbon polyimide resin, etc. A linear array of cores, each having a ridge structure with a cross-sectional dimension of around 50 μm□ for a multi-mode optical waveguide, and around 9 μm□ for a single mode optical waveguide, may be established in the inside of the optical waveguide film.

In the first embodiment of the present invention, a hollow architecture where the transmission line header are pulled out from the fully-assembled configuration shown in FIG. 1, is defined as "an intermediate package". And the fully-assembled architecture where the transmission line header are respectively inserted in to the inside of the receptacles 21, 22, 23 and 24 as shown in FIG. 1, is defined as "an LSI package provided with the I/F module" or "an LSI package". The definition is applicable in the second to fourth embodiments, which will be described hereinafter.

In the LSI package (LSI package provided with the I/F module) of the first embodiment of the present invention shown in FIG. 1, although a topology in which four aligned bundles of transmission lines 41, 42, 43 and 44 are extending along four directions of the transmission line headers is shown, another topology where three aligned bundles of transmission lines are taken out along three directions or less is also possible. And if the transmission line headers are arranged so as to form a polygonal shape over a pentagon, a topology in which a plurality of aligned bundles of transmission lines are taken out along a plurality of directions over five directions is also possible. Still, similar to the interposer, various materials of organic based materials including synthetic resin and inorganic based materials such as ceramic, glass are usable as the material of the header-bodies 31, 32 . . . .

After completing a sequence of processes for mounting the interposer substrate 1 on to the printed wiring board, the processes are carried out by existing packaging equipment (reflow furnace, etc.), the transmission line headers are inserted in to the corresponding receptacles 21, 22, 23 and 24 respectively so as to form the fully-assembled configuration shown in FIG. 1. The interposer substrate 1 is a packaging element (an interposer) for connecting the LSI chip 5 to the printed wiring board and can be connected to the printed wiring board by electric connecting terminals as similar to the configuration shown in FIG. 23. Namely, as well as the configuration of FIG. 23, the electric joints (board-connecting joints) for connecting the printed wiring board, are connected on to the contact lands (pads) for connecting the printed wiring board which is established on the second main surface (bottom surface) of the interposer substrate 1, though the illustration of the contact lands is omitted.

As well, though the board-connecting joints for connecting the printed wiring board are not illustrated, for instance, solder balls 10a, 10b . . . , 10r as shown in FIG. 23, are acceptable for the board-connecting joints. Concretely, various package architectures including a ball grid array (BGA) package, a pin grid array (PGA) package and a land grid array (LGA) package, etc. are acceptable for the interposer substrate 1. In addition, since the interposer substrate 1 is one of the packaging elements configured to connect the LSI chip (signal processing LSI) 5 to the motherboard (printed wiring board) in the fully-assembled configuration of the LSI package, a lead frame, a tape automated bonding (TAB) tape, or a resin substrate, etc. can be used as the interposer substrate 1. Therefore, various organic materials such as synthetic resin and inorganic materials such as ceramic, glass, etc. can be acceptable for the substrate material of the interposer substrate 1. Organic based resin includes phenol resin, polyester resin, epoxy resin, polyimide resin, fluorocarbon polymers, etc. Papers, woven glass fibers, or glass base materials, etc. are usable for a reinforcement base material serving as a base in a laminated slab configuration. A representative inorganic material for the substrate material is ceramic. Metallic substrates are used for the purpose of improving thermal dissipation characteristics of the interposer substrate 1. And the glass is used when a transparent substrate is necessary for the interposer substrate 1. Alumina ($Al_2O_3$), mullite ($3Al_2O_3.2SiO_2$), beryllia (BeO), aluminum nitride (AlN), silicon carbide (SiC), etc. are usable as ceramic substrates of the interposer substrate 1. In addition, metal-based substrates (metal insulated substrates) having a multi-level structure, laminating heat-resistant resin films of the polyimide based material on metals such as iron and copper, may well be used for the interposer substrate 1.

Figure 3:
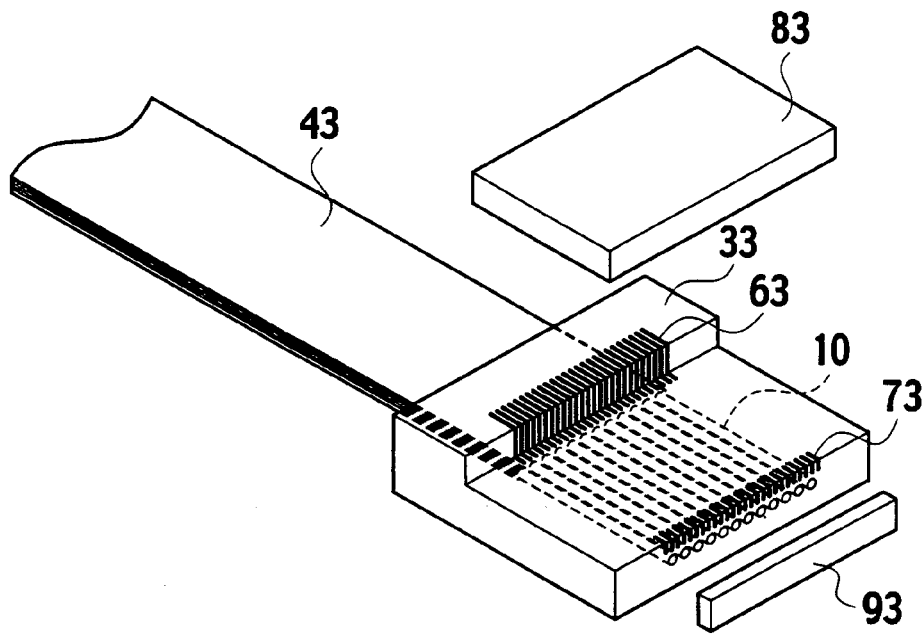
FIG. 3 is an exploded view of the transmission line header in which the interface IC chip is separately illustrated.

As shown in FIGS. 2 and 3, the header-base 33 according to the first embodiment is an insulating supporting body based on a concave heptahedron (L-type block), which is formed by a recessed portion of the chip-mounting face, prepared for mounting the interface IC chip 83. FIG. 2 shows a configuration in which the interface IC chip 83 serving as "the interface IC" is mounted. FIG. 3 shows an exploded view of the header-base 33 in which the interface IC chip 83 is separately illustrated. As easily understood from FIG. 3, the chip-mounting face is connected to a receptacle-contacting face disposed at the most upper level through a level difference (sidewall face) extending vertically to the receptacle-contacting face. Electrical terminals 63 extend from the chip-mounting face to the receptacle-contacting face through the level difference. The electrical terminals 63 are external-extraction electrodes for electrically connecting the header-base 33 with the electric joint (lead terminal) of the receptacle 23, when the header-base 33 is inserted in to the receptacle 23. As shown in FIG. 2, further, an optical semiconductor chip 93 is mounted on a connection end face orthogonal to the plane of the chip-mounting face. And intermediate interconnections 73 are placed in an interval between the connection end face for connecting the optical semiconductor chip 93 and the chip-mounting face. Following explanations will show that the header-base 33 according to the first embodiment can be adaptable for mass production at a very low cost, in spite of the high-precise position controlling mechanism (for instance, below 1 μm). Although the size of the header-base 33 depends on the holding length of the optical fiber (transmission line) 43 and the size of the interface IC chip 83 for an interface IC, etc., it is preferable that the height of the level difference between the receptacle-contacting face and the chip-mounting face is larger than the thickness of the interface IC chip 83.

FIGS. 2 to 3 are bird's eye views showing an end portion of the transmission line 43, among four transmission lines 41, 42, 43 and 44 shown in FIG. 1, and also showing a structure in which the header-base 33 is attached on to the end portion of the transmission line 43. Although illustrations and overlapped explanations are omitted, the other header-bodies 31, 32 and 34 are similarly attached on to the corresponding end portions of the transmission line 41, 42 and 44.

Each shape of the chip-mounting face, the receptacle-contacting face, and the level-difference face between the chip-mounting face and the receptacle-contacting face in the header-base 33 according to the first embodiment shown in FIG. 3, is a rectangle. The chip-mounting face and the receptacle-contacting face are respectively opposing in parallel to a flat bottom face, which has an area equivalent to a total area of the chip-mounting face and the receptacle-contacting face. In other words, the chip-mounting face and the opposing bottom face establish a thin parallel plate configuration, and the receptacle-contacting face and the opposing bottom face establish another thin parallel plate configuration. The chip-mounting face, the level-difference face and the receptacle-contacting face are respectively connected to the bottom face by two vertical concave polygons (L-shaped polygons) orthogonal to the planes of the chip-mounting face, and the receptacle-contacting face. A vertical end face of the thin parallel plate configuration, namely a rectangular face, four side faces of which are defined by a side of the chip-mounting face, a side of the bottom face and two side faces of the L-shaped polygons, serves as "the connection end face" for connecting the optical semiconductor chip 93. On the while, a vertical end face of the thick parallel plate configuration, namely a rectangular face, four side faces of which are defined by another side of the receptacle-contacting face and another side of the bottom face and another two side faces of the L-shaped polygon, serves as "the opposing end face" which is opposite in parallel to the connection end face.

Figure 4:
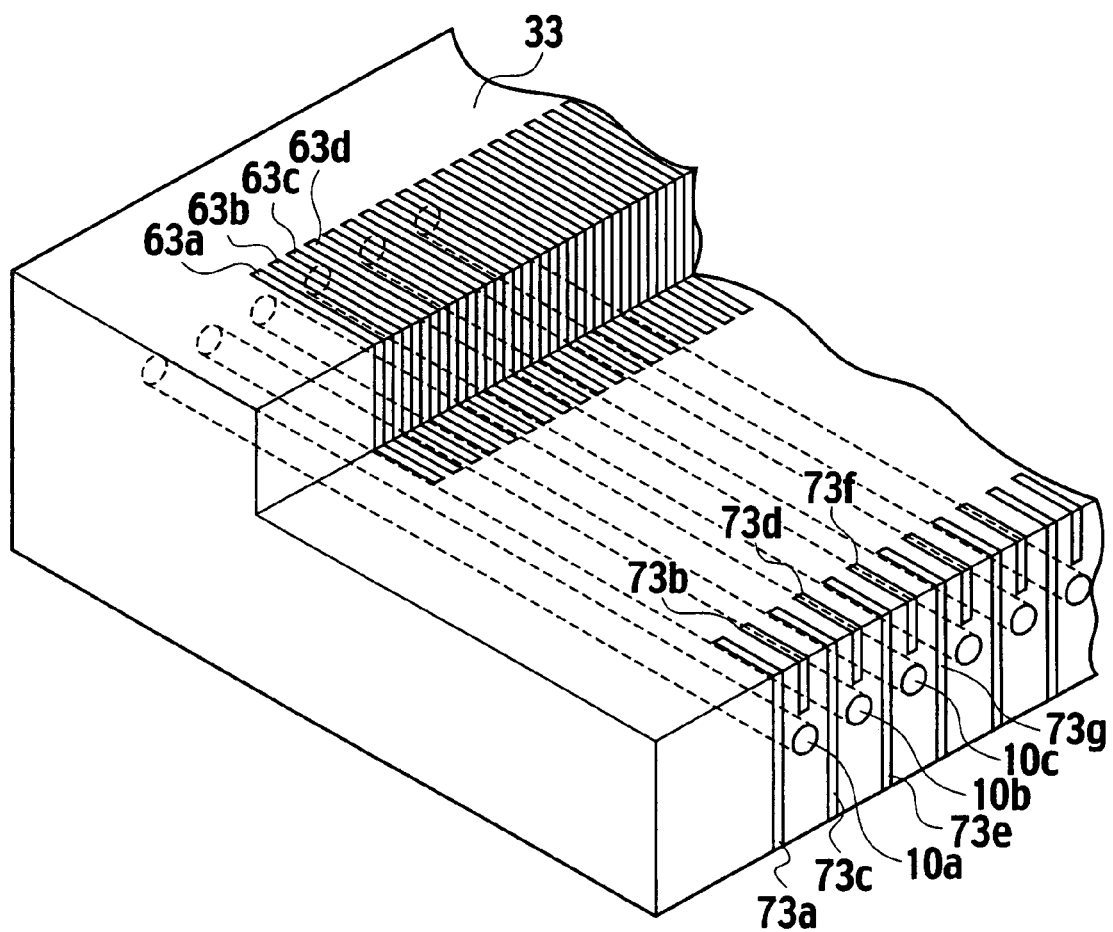
FIG. 4 shows an enlarged bird's-eye view of the transmission line header, illustrating electrical terminals and intermediate interconnections.

FIG. 4 illustrates in detail the electrical terminals 63 and the intermediate interconnections 73 shown in FIG. 3. As shown in FIG. 4, in the header-base 33 according to the first embodiment, a plurality of cylindrical holding sleeves penetrating an interval between the connection end face for connecting the optical semiconductor chip 93 and the opposing end face so as to hold mechanically the optical transmission lines (optical fibers) 10a, 10b, 10c, ..., respectively. And a plurality of intermediate interconnections 73a, 73b, 73c, 73d, ... are formed in parallel with each other, extending from the vicinity of the openings of the cylindrical holding sleeves to the face of the chip-mounting face. The intermediate interconnections 73a, 73b, 73c, 73d, ... are analogue interconnections, or single end wirings (two-pole interconnections) which are formed by ground wiring 73a, 73c, 73e, 73g, ... and signal wirings 73b, 73d, 73f, ... which are alternately arranged with the ground wiring 73a, 73c, 73e, 73g, ... When using intermediate interconnections 73a, 73b, 73c, 73d, ... each having a line width of 50 μm, which are arranged with a space width of 75 μm, the arrangement of the intermediate interconnections 73a, 73b, 73c, 73d, ... can be aligned with a bundle of optical fibers 10a, 10b, 10c, ..., which are arranged with a pitch of 250 μm.

Figure 5:
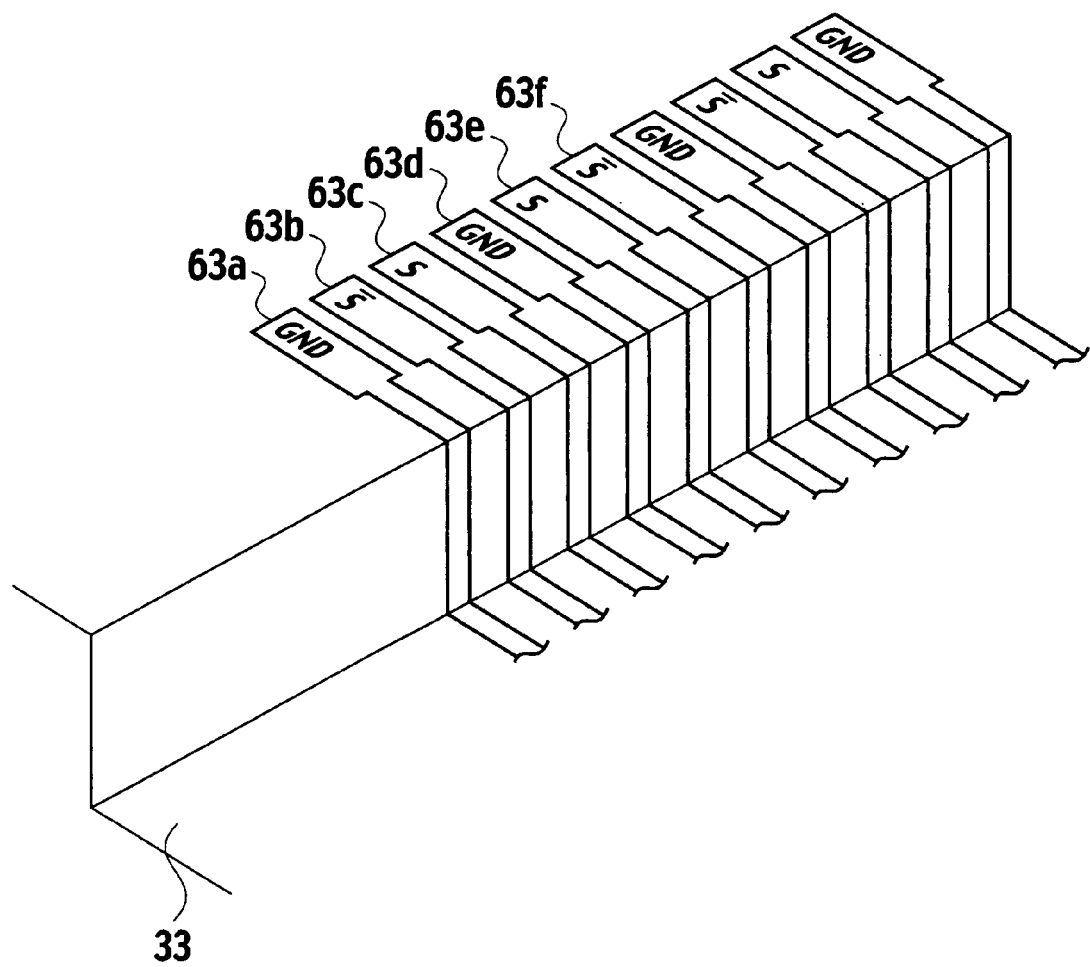
FIG. 5 shows a further enlarged bird's-eye view of the transmission line header, illustrating details of the arrangement of the electrical terminals.

On the while, the electrical terminals 63a, 63b, 63c, 63d, ... which establish differential digital interconnections (three-pole interconnections implemented by a signal wiring, an inverted signal wiring and a ground wiring), extend along a route of the chip-mounting face to the receptacle-contacting face through the level-difference face (sidewall face). FIG. 5 shows details of the arrangement of the electrical terminals 63a, 63b, 63c, 63d, ...

As shown in FIG. 5, the configuration of the electrical terminals 63a, 63b, 63c, 63d, ... establishing the differential digital interconnections encompasses ground wirings (GND) 63a, 63d, a signal wiring 63c on which a signal S propagates, and an inverted signal wiring 63b on which an inverted signal S bar propagates. The phase of the inverted signal S bar is inverted against the signal S. The inverted signal wiring 63b and the signal wiring 63c are sandwiched by the ground wirings (GND) 63a, 63d. The differential digital interconnections further encompass a signal wiring 63e on which a signal S propagates, and an inverted signal wiring 63f on which an inverted signal S bar propagates. The signal wiring 63e and the inverted signal wiring 63f are sandwiched by the ground wiring 63d and another ground wiring adjoining the inverted signal wiring 63f. The configuration of the differential digital interconnections can be aligned with the arrangement of the optical fibers 10a, 10b, 10c, ..., which are arranged with a pitch of 250 μm, when the configuration of the differential digital interconnections is implemented by the electrical terminals 63a, 63b, 63c, 63d, . . . , each having a line width of 40 µm, so that a space width between the inverted signal wiring 63b and the signal wiring 63c is 50 µm, a space width between the ground wiring 63a and the inverted signal wiring 63b is 40 µm, and a space width between the ground wiring 63d and the signal wiring 63c is 40 µm. When the electrical terminals 63a, 63b, 63c, 63d, . . . are not differential digital interconnections, but two-pole interconnections having an arrangement in which the ground wiring and the signal wirings are alternately placed, the configuration of the electrical terminals 63a, 63b, 63c, 63d, . . . can be aligned with an arrangement of the optical fibers 10a, 10b, 10c, . . . with an arrangement pitch of 250 µm, by using electrical terminals 63a, 63b, 63c, 63d, . . . , each having a line width of 50 µm, which are arranged with a space width of 70 µm.

In FIG. 5, the header-base 33 of the first embodiment is formed so that a line width of each end of the electrical terminals 63a, 63b, 63c, 63d, . . . is widened to 60 µm. The ends of the electrical terminals 63a, 63b, 63c, 63d, . . . are disposed at the contacting site between the electrical terminals 63a, 63b, 63c, 63d, . . . and the receptacle 23. On the contrary, the space width between the end of inverted signal wiring 63b and the end of the signal wirings 63c is narrowed to 30 µm, the space width between the end of the ground wiring 63a and the end of the inverted signal wiring 63b is narrowed to 20 µm, and the space width between the end of the ground wiring 63d and the end of the signal wiring 63c is narrowed to 20 µm, so as to facilitate electrical connection with the receptacle 23. When using the two-pole interconnections instead of the differential digital interconnections, a configuration in which a line width of each end of the electrical terminals 63a, 63b, 63c, 63d, . . . on the receptacle-contacting face 23 is widened to 100 µm and a space width between the end of the electrical terminals 63a, 63b, 63c, 63d, . . . is narrowed to 25 µm can facilitate the electrical connection with the receptacle 23.

As shown in FIG. 2, on the header-base 33 according to the first embodiment, the optical semiconductor chip 93 and the interface IC chip 83 are mounted with flip-chip bonding using stud bump etc. The configuration shown in FIGS. 3 and 4 is formed so that the optical fibers 10a, 10b, 10c, . . . are inserted into the cylindrical holding sleeves such that the optical fibers 10a, 10b, 10c, . . . can make contact close enough to the optical semiconductor chip 93. Alternatively, the optical fibers 10a, 10b, 10c, . . . can contact with the top surface of the optical semiconductor chip 93. In a sequence of assembly processes, when the optical fibers 10a, 10b, 10c, . . . are inserted into the cylindrical holding sleeves so as to be held by the header-base 33, the optical semiconductor chip 93 sometimes comes off from electrode wirings 26a, 26b, 26c, 26d . . . (see FIG. 6), because the optical semiconductor chip 93 is pushed too much by the optical fibers 10a, 10b, 10c, . . . To prevent peeling off of the optical semiconductor chip 93, the optical semiconductor chip 93 may be sandwiched by a reinforcement plate attached on to the rear face of the optical semiconductor chip 93, and by the optical fibers 10a, 10b, 10c, . . . , before fixing the optical semiconductor chip 93 to the header-base 33.

However, since the optical semiconductor chip 93 is generally fragile, the optical fibers 10a, 10b, 10c, . . . must be pushed into a position until an opposite pressure exerted by the reinforcement plate against a force of the optical fibers 10a, 10b, 10c, . . . begins to increase slightly, through monitoring the increase of the opposite pressure. With regard to a surface morphology of an end face of each of the cores of the optical fibers 10a, 10b, 10c, . . . , an optically flat end face with comparatively high-precision can be obtained by cleaving so as to separate general optical fibers with an optical fiber-cutter, because each of the optical fibers 10a, 10b, 10c, . . . is not split by breaking methodology nor by mechanical cutting methodology, but is split by cleavage methodology, such that a side surface of each of the optical fibers 10a, 10b, 10c, . . . is slightly recessed by an edge of a diamond tool, and at the slightly recessed portion, each of the optical fibers 10a, 10b, 10c, . . . is transversely pressured. Therefore, according to the header-base 33 of the present invention, high-cost processes such as grinding and polishing can be eliminated by using a cleaved end face of the core of the optical fibers 10a, 10b, 10c, . . . as it is.

For the material of the header-base 33, various organic materials such as synthetic resin and inorganic materials such as ceramic, glass, etc. can be acceptable. Organic based resin includes epoxy resin, polyphenylenesulphide (PPS) resin, polybutylene terephthalate (PBT) resin, phenol resin, polyester resin, polyimide resin, fluorocarbon polymers, etc. And glass and quartz are usable when a transparent substrate is necessary for the header-base 33. Alumina ($Al_2O_3$), mullite ($3Al_2O_3.2SiO_2$), zirconia ($ZrO_2$), beryllia (BeO), aluminum nitride (AlN), silicon carbide (SiC), etc. are usable as ceramic substrates of the header-base 33. Especially, it is suitable to use epoxy resin in which about 80% of glass filler of about 30 µm is mixed for establishing the header-base 33 since the header-base 33 can be formed simply and highly precisely, using a resin mold by metal mold.

The cylindrical holding sleeves extend parallel to the plane of the chip-mounting face, the bottom face and two side faces of L-shaped polygon respectively, and are orthogonal to the connection end face for connecting the optical semiconductor chip 93 and to the opposing end face. Because, generally, an outer diameter of a cladding layer of an optical fiber is 125 µm, an inside diameter of the holding sleeves may be set at about 125.5–128 µm and for the outer diameter of the cladding layer of the optical fiber, 125 µm. A pitch of an arrangement of the holding sleeves may be selected as a double of the outer diameter of the cladding layer, in view of the thickness of the coating layer (see FIG. 8) which covers the optical fibers 10a, 10b, 10c, . . . .

Figure 6:
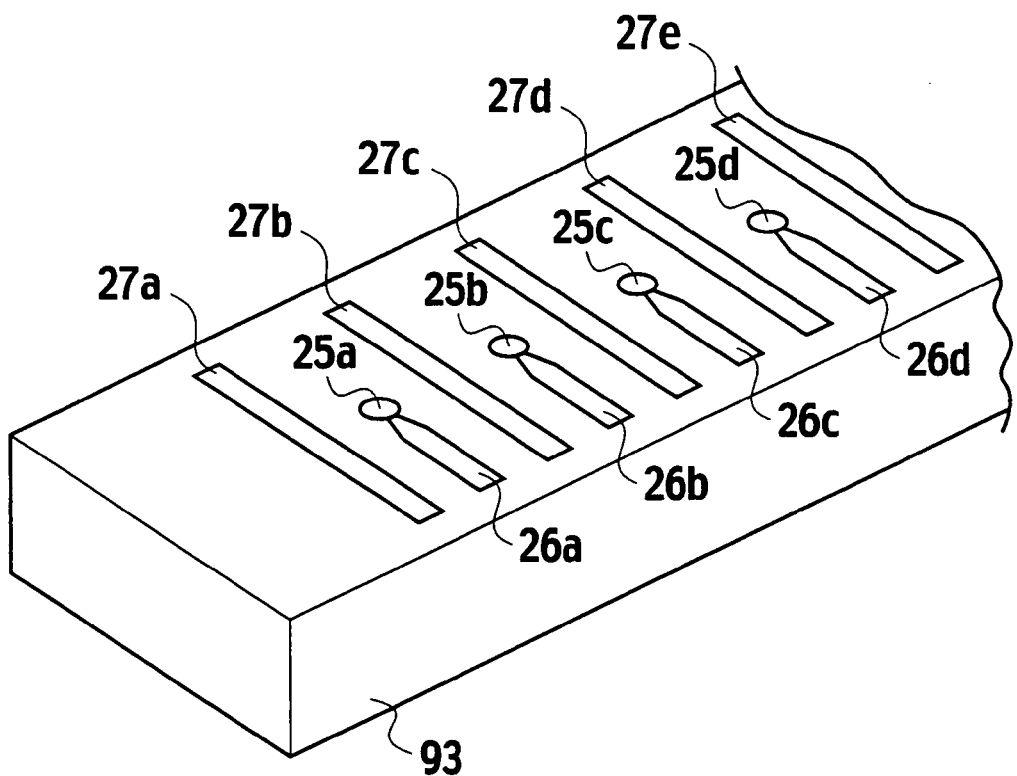
FIG. 6 is a schematic bird's-eye view illustrating a configuration of the optical semiconductor chip according to the first embodiment of the present invention.
Figure 7:
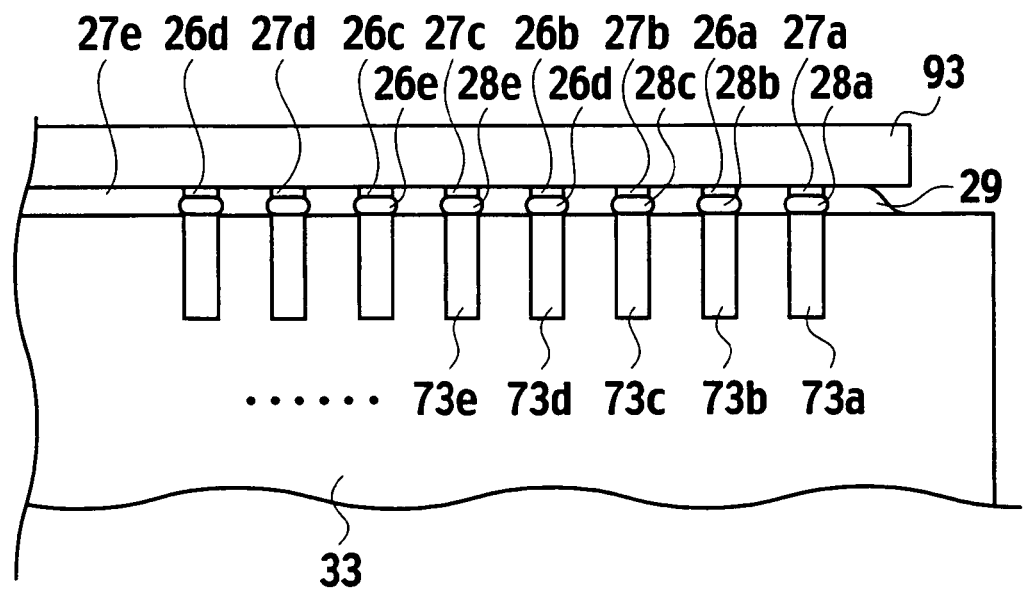
FIG. 7 is a schematic upper face view illustrating an assembled configuration in which the optical semiconductor chip is mounted on the transmission line header.

FIG. 6 shows a schematic bird's-eye view explaining an outline of the optical semiconductor chip 93, which is mounted, on the header-base 33 according to the first embodiment. FIG. 7 is a schematic upper face view where the optical semiconductor chip 93 is mounted on the header-base 33, which is already explained in FIGS. 3 to 4. As shown in FIG. 6, at a top surface of the optical semiconductor chip 93, a plurality of active areas 25a, 25b, 25c, 25d, . . . are integrated. And further, a plurality of electrode wirings 26a, 26b, 26c, 26d, . . . for propagating signals and the ground wirings 27a, 27b, 27c, 27d, . . . are delineated on the top surface of the optical semiconductor chip 93.

When the optical semiconductor chip 93 merges an array of photo-detecting elements so as to align to a fiber-ribbon of twelve cores, twelve photo-detecting elements are integrated on an element-formation face of the optical semiconductor chip 93. For instance, in the active areas 25a, 25b, 25c, 25d, . . . formed of a compound semiconductor such as gallium arsenide (GaAs), twelve GaAs based pin photodiodes can be established, respectively. A plurality of heavily doped regions, in which donors or acceptors of about $1\times10^{18}$ cm$^{-3}$–$1\times10^{21}$ cm$^{-3}$ are doped, are formed at the most upper layer of the active areas 25a, 25b, 25c, 25d, . . . The heavily doped regions serve as anode regions or cathode regions of pin diodes. Then, on the top surface of the heavily doped regions of the active areas 25a, 25b, 25c, 25d . . . , a plurality of metallic electrodes which facilitate ohmic contact with the active areas 25a, 25b, 25c, 25d . . . are connected so as to implement a plurality of electric interconnects 26a, 26b, 26c, 26d . . . , surrounding entrance windows of the photo-detecting elements, the diameters of the entrance windows are larger than the outer diameters of cores of the optical fibers, with circular frame configurations. Generally, an outer diameter of a core of multi- mode optical fibers 10a, 10b, 10c, 10d . . . is 50 μm and an outer diameter of a core of single-mode optical fibers 10a, 10b, 10c, 10d . . . is 9 μm. The outer diameters of the active areas 25a, 25b, 25c, 25d, . . . may preferably be set larger than the outer diameter of the cores mentioned above, so that the active areas 25a, 25b, 25c, 25d, . . . can receive all of the light beams emitted from the cores of the optical fibers, from the viewpoint of achieving high efficiency. In view of the operational frequency of the optical signals, there might be a case in which owing to a delay due to the CR time constant of elements, the area of each of the active areas is limited. Since, for instance, to receive an optical signal of 10 Gbps, a diameter of about 60 μm becomes an upper limit for a geometry of a GaAs based photo-detecting element, it is necessary that a photo-detecting element is disposed very close to the end face of the optical fibers owing to the beam divergence. Instead of metallic electrodes, transparent electrodes such as tin (Sn) doped indium oxide ($In_2O_3$) film (ITO), indium (In) doped zinc oxide (ZnO) film (IZO), gallium (Ga) doped zinc oxide film (GZO), tin oxide ($SnO_2$) may be used. Then, the electric interconnects 26a, 26b, 26c, 26d . . . made of metals such as aluminum (Al) or aluminum alloy (An LSI, Al—Cu—Si), can be connected to the transparent electrodes so as to establish ohmic contacts with the transparent electrodes.

When the optical semiconductor chip 93 merges an array of light-emitting elements such as vertical cavity surface emitting lasers (VCSEL), the active areas 25a, 25b, 25c, 25d, . . . correspond to light-emitting faces of the VCSELs which are arranged in 250 μm pitch. GaAlAs/GaAs based lasers, each of which emits light of about 850 nm wavelength, formed on a substrate of compound semiconductor, etc. are acceptable for the VCSELs. When using a fiber-ribbon cable of twelve cores, twelve VCSELs should be integrated on an element formation face of the optical semiconductor chip 93. A plurality of light-emitting faces of the VCSELs are defined so that each of the light-emitting faces is smaller than the outer diameter of the core of the optical fiber. In the active area 25a, 25b, 25c, 25d, . . . , a plurality of metallic electrodes for facilitating ohmic contact with electrode regions, which serve as anode regions or cathode regions of the light-emitting elements, are delineated. The metallic electrodes surround each of the light-emitting faces, which is smaller than the core of the optical fiber, in a circular frame configuration. And each of the metallic electrodes may well be merged with the corresponding one of the electric interconnections 26a, 26b, 26c, 26d . . . shown in FIG. 6 so as to implement a single piece of metallic pattern. A diameter of the light-emitting face of the VCSEL can sufficiently be made smaller than the diameter of a core of multi-mode optical fiber (MMF), because in a GaAs based light-emitting element, for instance, emitting light of about 850 nm wavelength, operating at 10 Gbps, the diameter of the light-emitting face can be established to be about 10 μm, so as to achieve a high utilization efficiency of light beams. In a case of a single-mode optical fiber (SMF), if the diameter of the light-emitting face is smaller than the diameter of a single-mode optical fiber, such a problem that high-speed operation cannot be achieved due to an increase of substrate temperature by operation may occur. Then, although the decrease in the utilization efficiency of light beams must be considered for the single-mode optical fiber, because the light-emitting face can not be always made smaller than the diameter of the core of the single-mode optical fiber, the diameter of the active areas 25a, 25b, 25c, 25d . . . can be selected to be several decade μm, anyway.

In the header-base 33 of the first embodiment shown in FIG. 6, topology of the electric interconnections 26a, 26b, 26c, 26d, . . . , each of which has a tapered portion and a constant width strip portion such that through the tapered portion, in which the width of each of the electric interconnections 26a, 26b, 26c, 26d, . . . gradually widen from the outer diameters of the active areas 25a, 25b, 25c, 25d, . . . so that each of the active areas 25a, 25b, 25c, 25d, . . . can be connected to the corresponding strip portion, is shown, the geometry and the topology of the electric interconnections 26a, 26b, 26c, 26d, . . . are not limited to the geometry and the topology shown in FIG. 6.

In addition, on the electric interconnections 26a, 26b, 26c, 26d, . . . , a passivation film such as a silicon oxide film ($SiO_2$), a phosphosilicate glass (PSG) film, a boro-phosphate-silicate glass (BPSG) film, a silicon nitride ($Si_3N_4$) film or a polyimide film can be deposited, such that each part of the electric interconnections 26a, 26b, 26c, 26d, . . . is exposed through a window formed in the passivation film.

Although the electric interconnections 26a, 26b, 26c, 26d, . . . may be formed of an electrically conductive film such as a polysilicon film or a refractory metal film such as tungsten (W), titanium (Ti), or molybdenum (Mo) film, it is preferable that the electric interconnections 26a, 26b, 26c, 26d, . . . are covered by a thin aluminum (Au) film laminated on the top surface of the electrically conductive film from a viewpoint of connection reliability.

Second main electrodes isolated from the electric interconnections 26a, 26b, 26c, 26d, . . . are connected to the ground wirings 27a, 27b, 27c, 27d, 27e, . . . , respectively. The "second main electrode" is other one of the anode and cathode electrodes of the light-mitting elements. For example, if the first main electrode is the anode electrode, the second main electrode is the cathode electrode of the light-emitting element.

The ground wirings 27a, 27b, 27c, 27d, 27e, . . . and the electric interconnections 26a, 26b, 26c, 26d, . . . , may be simultaneously delineated, utilizing a metal mask, by sputtering metallic thin films such as copper (Cu) and aluminum (Al) etc.

FIG. 7 shows a configuration where the optical semiconductor chip 93 is mounted on the top surface of the connection end face of the header-base 33 by a face down (flip-chip) configuration, facing down the top surface, in which the active areas 25a, 25b, 25c, 25d, . . . are merged, to the connection end face of the header-base 33. By adopting the face down (flip-chip) configuration, each of the electric interconnections 26a, 26b, . . . on the optical semiconductor chip 93 are electrically connected to the intermediate interconnections 73b, 73d, . . . on the header-base 33 by the electric joints (electrical conductive bumps) 28b, 28d, . . . respectively. And also each of the ground wirings 27a, 27b, 27c, . . . on the optical semiconductor chip 93 are electrically connected to the intermediate interconnections 73a, 73c, 73e, . . . on the header-base 33 by the electric joints (electrical conductive bumps) 28a, 28d, 28g, . . . respectively. For the material of the electric joints (electrical conductive bumps) 28a, 28b, 28c, 28d, . . . solder balls, gold (Au) bumps, silver (Ag) bumps, copper (Cu) bumps, nickel-gold (Ni—Au) alloy bumps or nickel-gold-indium (Ni—Au—In) alloy bumps, etc. are acceptable. An eutectic solder having a composition ratio such as tin (Sn):lead (Pb)=6:4 with diameter 10 μm to 25 μm, height 5 μm to 20 μm can be used for the solder ball. Or, eutectic solders having such composition ratios of Sn:Pb=5:95 and Sn:Au =2:8 may be used for the solder ball. By this configuration, input/output electric signals of the optical semiconductor chip 93 mounted on the connection end face can be extracted to the outside at the chip-mounting face by the intermediate interconnections 73b, 73d, . . . which extend to the chip-mounting face.

In FIG. 7, the electric joints (electrical conductive bumps) may be encapsulated by underfill resin 29, which is made by injecting transparent resin liquid) from a connection end face for mounting the optical semiconductor chip 93. The transparent underfill resin 29 can be injected from the rear of the cylindrical holding sleeves of the optical fibers 10a, 10b, 10c, . . . For the material of the underfil resin 29, transparent resin such as acrylic, silicone and epoxy are usable and it is more efficient to use such underfil resin, which is hardened by heat treatment, alternatively by ultraviolet beam.

Figure 8:
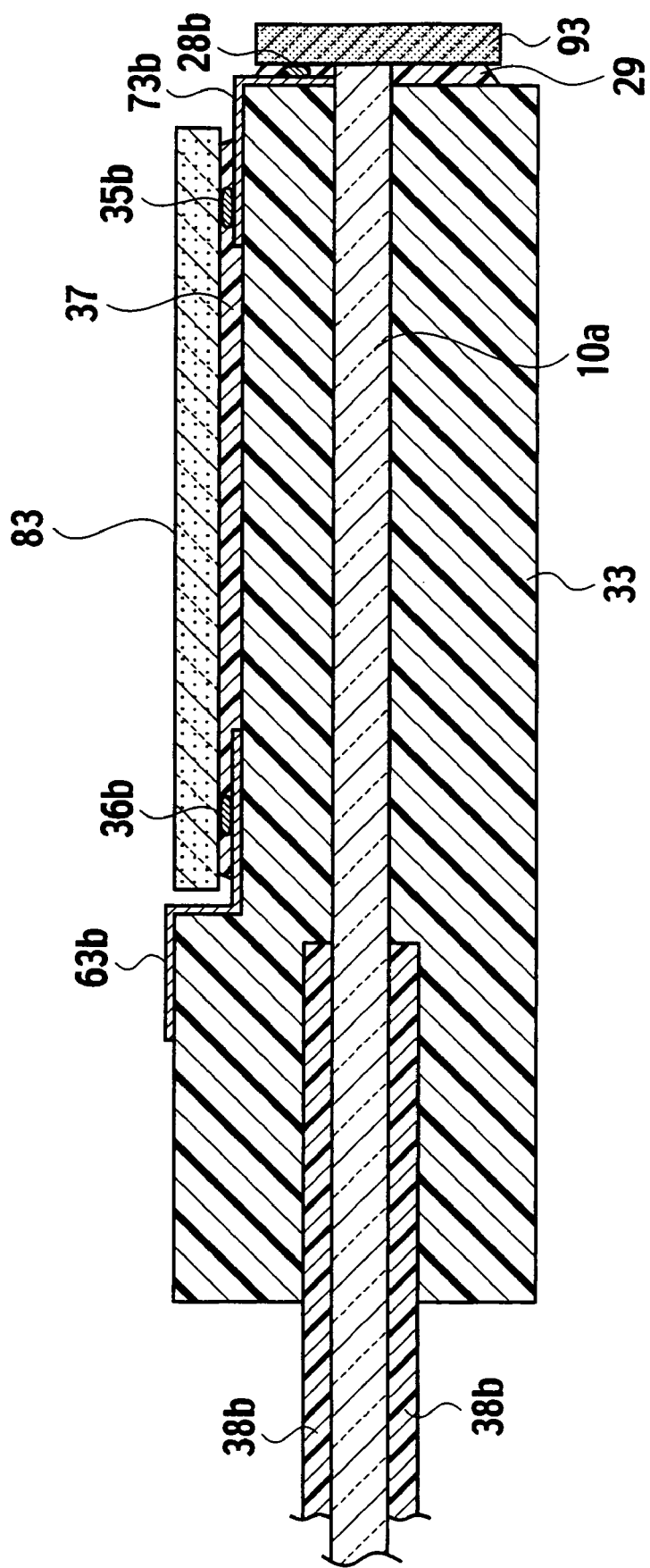
FIG. 8 is a schematic cross-sectional view of the transmission line header, on which the interface IC chip and the optical semiconductor chip are mounted.

FIG. 8 shows a cross-sectional view of the header-base 33 of the first embodiment, which is formed by cutting off with a plane along the central axis of the optical fiber 10a, 10b, 10c, . . . shown in FIGS. 3 and 4. As shown in the cross-sectional view of FIG. 8, the intermediate interconnection 73b extends from the connection end face over to the chip-mounting face of the header-base 33 and the electrical terminal electrical terminal 63b extends along a route from the chip-mounting face to the receptacle-contacting face through the level difference (sidewall face). On the while, since the intermediate interconnections 73a, 73b, 73c, 73d, . . . are formed from the connection end face over to the chip-mounting face, an axis direction of the optical fibers 10a, 10b, 10c, . . . can keep parallel with the extending direction of the intermediate interconnections 73a, 73b, 73c, 73d, . . . on the chip-mounting face. The configuration enables the axis direction of the optical fibers 10a, 10b, 10c, . . . to be orthogonal to a mounting plane direction, which facilitate the thinning of the header-base 33 as a whole.

The electrical terminals 63a, 63b, 63c, 63d, . . . and the intermediate interconnections 73a, 73b, 73c, 73d, . . . are delineated as strip patterns of metallic thin films such as aluminum (Al) and copper (Cu) etc., and can be easily delineated by metallization processes with a metal mask, through which the metallic thin film is formed by sputtering or plating technique. The electrical terminals 63a, 63b, 63c, 63d, . . . and the intermediate interconnections 73a, 73b, 73c, 73d, . . . can be also made of other metallic thin films including copper alloys such as Cu—Fe, Cu—Cr, Cu—Ni—Si, Cu—Sn etc, ferronickel-alloys such as Ni—Fe, Fe—Ni—Co etc, and composite material of copper and stainless steel, etc. In addition, these electric interconnects may be provided by nickel (Ni) plating and/or gold (Au) plating, etc. on these metallic materials. Titanium (Ti) and platinum (Pt) are also available as an under-laying metal.

On the top surface of the interface IC chip 83 serving as the interface IC, a plurality of signal input/output terminals (bonding pads) are arranged, though the illustration was omitted. And each of the bonding pads on the top surface of the interface IC chip 83 is mutually and electrically connected to the intermediate interconnection 73b and the electrical terminal 63b through the electrical conductive bumps 35b and 36b respectively. Similarly the other electrical terminals 63a, 63c, 63d, . . . and the other intermediate interconnections 73a, 73c, 73d . . . are also mutually and electrically connected to the bonding pads on the top surface of the interface IC chip 83 through the other electrical conductive bumps (not shown).

Though as shown in FIG. 8, the electric joints (electrical conductive bumps) may be encapsulated by underfill resin 37 which is made by injecting resin liquid) from lateral side of the chip-mounting face of the interface IC chip 83, it is not necessary to use transparent resin for the underfill resin 37. The underfill resin 37 may be made of anisotropic conductive materials in which gold (Au), silver (Ag), nickel (Ni) or metallic powders such as titanium-nickel alloy Ti—Ni) etc. are dispersed in insulating resins such as urethane resin and epoxy resin etc.

Figure 9:
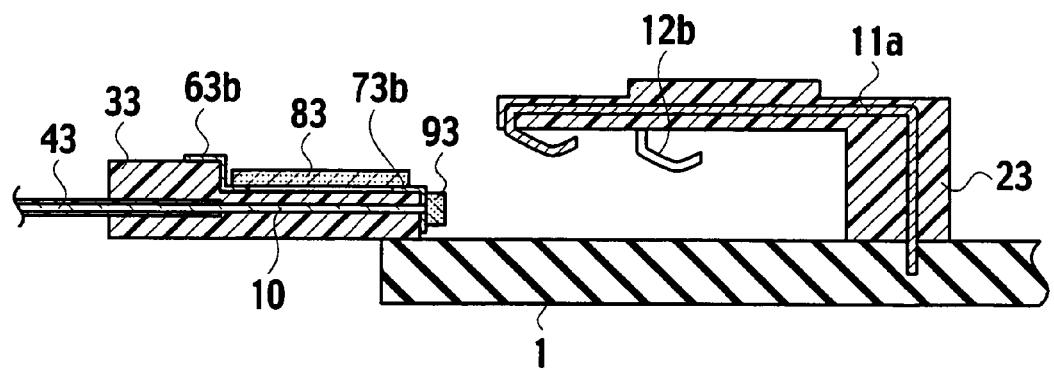
FIG. 9 is a schematic cross-sectional view showing a receptacle and a transmission line header, which is prepared to be inserted in to the receptacle, illustrating one of the lead terminals of the receptacle.
Figure 10:
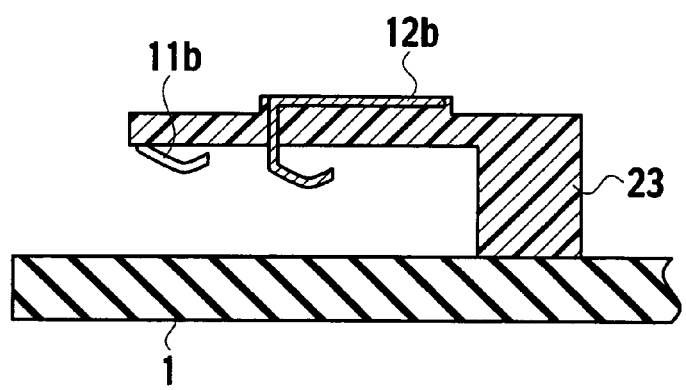
FIG. 10 is a cross-sectional view illustrating one of the heat-radiation terminals (thermal connectors), on a cross-sectional plane cut along the extending direction of the heat-radiation terminal, located at rear side of the cross-sectional plane showing the lead terminal of FIG. 9.
Figure 11:
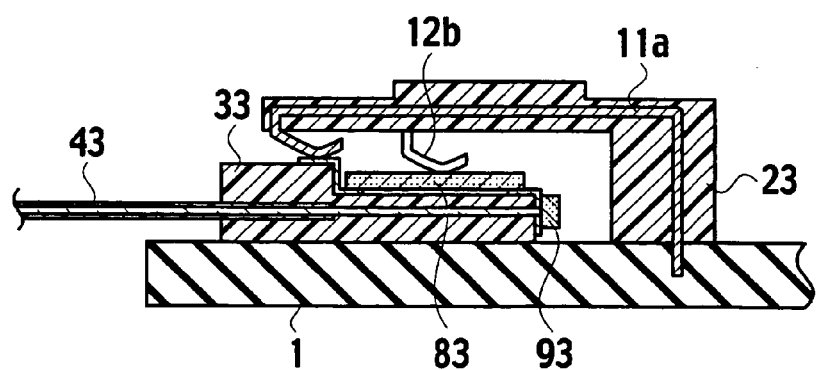
FIG. 11 is a schematic cross-sectional view showing an assembled structure of a receptacle and a transmission line header, which is inserted in the receptacle.

FIGS. 9 and 10 show a schematic cross-sectional view showing a structure of the receptacle 23 adapted for accepting the transmission line header implemented by the header-base 33 of the first embodiment. The receptacle 23 shown in FIGS. 9 and 10, the cross-section of which is L type, forms a box-type structure with the interposer substrate 1, as understood from a schematic bird's eye view of FIG. 1. One of the faces of the box, through which the transmission line header implemented by the header-base 33 to be inserted, is opened in the box-type structure.

As shown in FIG. 9, the receptacle 23 encompasses a lead terminal (signal lead) 11a configured to electrically connect the interface IC chip 83 to the LSI chip 5. FIG. 9 is a cross-sectional view of the receptacle 23 and the transmission line header 23 of the first embodiment, which are cut along an extending direction of the lead terminal (signal lead) 11a. The lead terminal 11a is buried within a roof and a rear-wall of the receptacle 23, which implement a L-shaped cross-sectional view as shown in FIG. 9. Further, one end of the lead terminal (signal lead) 11a extends to an intermediate level of the thickness of the interposer substrate 1, penetrating thorough the rear-wall of the receptacle 23. The other end of the lead terminal (signal lead) 11a protrudes from the roof of the receptacle 23, the roof implementing a portion of the L-shaped receptacle 23 in a cross sectional view.

The protruding portion of the lead terminal 11a establishes a V-hook shape, which has elasticity.

As shown in FIG. 9, the receptacle 23 further encompasses a thermal connector (heat-radiation lead) 12b configured to transport away thermal energy from the interface IC chip 83. In FIG. 9, a tip of the thermal connector (heat-radiation lead) 12b of V-hook shape is protruding downward from a ceiling of the receptacle 23, located at rear side of the cross sectional view. Although illustrations are omitted in FIG. 9, another heat-radiation terminal 12a is located at near side of the paper.

FIG. 10 is a cross-sectional view of a thermal connector (heat-radiation lead) 12b which is cut along the extending direction of the heat-radiation terminal 12b located at rear side of the lead terminal 11a of the receptacle 23 in FIG. 9. A principal part of the heat-radiation terminal 12b is buried in a convex portion, which is disposed on the top surface of the roof of the receptacle 23 formed into the L-shaped cross section, as shown in FIG. 10. The convex portion extends in the direction perpendicular to the paper at a central portion of the roof of the receptacle 23. A V-hook shaped tip of the heat-radiation terminals 12b is protruding in the downward from the ceiling of the receptacle 23. In FIG. 10, a tip of a lead terminal 11b of V-hook shape is protruding downward from the ceiling of the receptacle 23, at rear side of the cross sectional view. Further, the heat-radiation terminal 12c is located, being concealed at rear side of the paper.

In other words, the lead terminals 11a, 11b, . . . and the thermal connectors (12a), 12b, (12c) . . . are regularly and alternately arranged in a perpendicular direction of the paper in FIGS. 9 and 10. A pitch of the lead terminals 11a, 11b, . . . is defined such that the arrangement of the lead terminals 11a, 11b, . . . corresponds to the arrangement of the electrical terminals 63b, 63c; 63e, 63f; . . . The arrangement of the thermal connectors (12a), 12b, (12c), . . . along the perpendicular direction of the paper in FIGS. 9 and 10, corresponds to the arrangement of the electrical terminals 63a, 63d, 63g.

The height (horizontal level) of the lead terminals 11a, 11b, . . . and the thermal connectors (12a), 12b, (12c), . . . of the receptacle 23 of the first embodiment shown in FIGS. 9 and 10, are adjusted such that the lead terminals 11a, 11b, . . . can contact with the electrical terminals 63b, 63c; 63e, 63f; . . . of the header-base 33 of FIG. 2, and that the thermal connectors (12a), 12b, (12c), . . . can contact with the bottom face of the interface IC chip 83 mounted on the header-base 33. In the assembled condition in which the transmission line header implemented by the header-base 33 is inserted in to the receptacle 23, each of the lead terminals 11a, 11b, . . . is independently pressed so as to be contacted with the corresponding electrical terminals 63b, 63c; 63e, 63f; . . . of the header-base 33, and each of the thermal connectors (12a), 12b, (12c), . . . is independently pressed so as to be contacted with the bottom face of the interface IC chip 83.

Especially, when using the configuration of FIG. 2, it is preferable that the contacting height (contacting level) of the lead terminals 11a, 11b, . . . is set higher than the contacting height (contacting level) of the thermal connectors (12a), 12b, (12c), . . . so as to prevent the interface IC chip 83 from destruction, which may be caused by contacting and rubbing with the lead terminals 11a, 11b, . . . when the transmission line header implemented by the header-base 33 is inserted into the receptacle 23.

Further, in the receptacle 23 and the transmission line header implemented by the header-base 33 of the first embodiment, the lead terminals 11a, 11b, . . . are regularly and alternately arranged with the thermal connectors (12a), 12b, (12c), . . . in the perpendicular direction of the paper, as shown in FIGS. 9 to 10, it is preferable that the thermal connectors (12a), 12b, (12c), . . . electrically connect to the electrical terminals 63a, 63d, 63g . . . at ground potential, respectively. The configuration in which the thermal connectors (12a), 12b, (12c), . . . electrically connect to the electrical terminals 63a, 63d, 63g . . . at ground potential can decrease noises such as cross-talk between the electrical terminals 63b, 63c; 63e, 63f; . . . .

Each V-hook shaped tip of the lead terminals 11a, 11b, . . . and the thermal connectors (12a), 12b, (12c), . . . of the receptacle 23 of the first embodiment, implements a plate spring, each having a plate width of 30 μm to 50 μm. For materials of the receptacle 23, for instance, polyphenylene-sulphide (PPS) resin, liquid crystal polymer (LCP) and polyimide resin in which glass filler is mixed, are acceptable. It is preferable that the lead terminals 11a, 11b, . . . are formed of electrically conductive material having elasticity and that the thermal connectors (12a), 12b, (12c), . . . are formed of thermally conductive material having elasticity. For establishing the lead terminals 11a, 11b, . . . and the thermal connectors (12a), 12b, (12c), . . . of the receptacle 23, for instance, a plurality of conductive strips such as phosphor bronze strips, having elasticity, are insert-molded in the receptacle 23, and each of the protruding portions of the V-hook shaped tips of the lead terminals 11a, 11b, . . . and the thermal connectors (12a), 12b, (12c), . . . of the receptacle 23 can be coated with Ni plating, nickel (Ni) plating and/or gold (Au) plating, etc.

Figure 12:
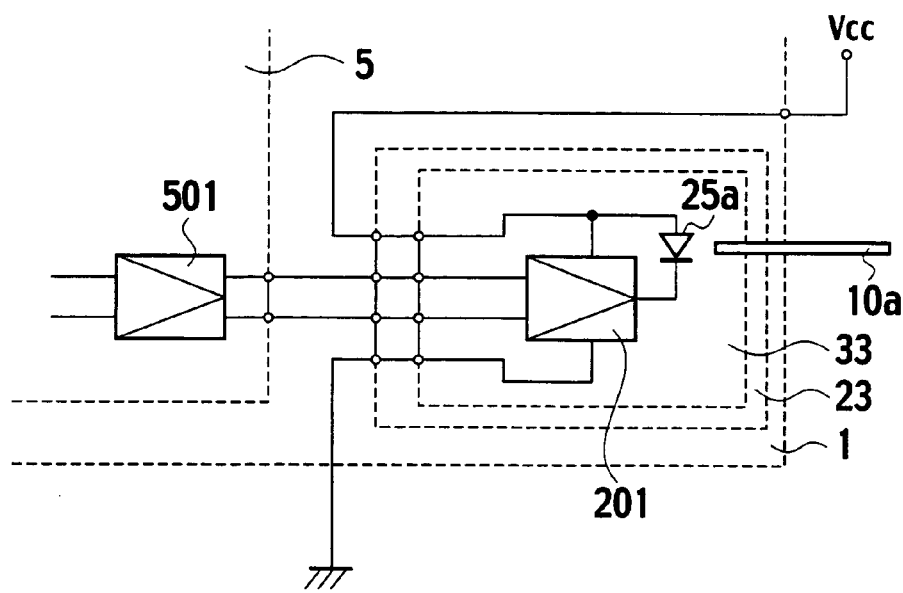
FIG. 12 is a functional block diagram of the LSI package according to the first embodiment of the present invention, showing a circuit configuration including an output buffer circuit of the signal processing LSI chip, a buffer amplifier in the interface IC chip and a surface emitting laser.

Next, an example of electric circuit configuration of the LSI package according to the first embodiment is explained. Although the explanation will be made referring to an optical output interface, an optical input interface and an input/output interface of a coaxial transmission line can be also adapted for the LSI package. FIG. 12 is a functional block diagram showing an electric circuit configuration including an output buffer circuit 501 of the signal processing LSI chip 5 and an buffer amplifier 201 as an example in which the interface IC chip 83 is simplified most, and a surface emitting laser 25a, a power terminal Vcc. And broken lines of FIG. 12 show the block boundary of the circuit component.

First, the output buffer cuuuit 501 is a buffer circuit between an internal circuit of the LSI chip 5 and a peripheral interconnection, configured to deliver digital signals as an output-signal. As to the logic circuit configurations for supplying the digital signal, various logic circuits that facilitate high-speed signal interconnections such as emitter-coupled logic (ECL), current-mode logic (CML), low-voltage differential signaling (LVDS) are useable. Three-pole interconnections (positive, negative, GND) should be employed for the digital signal by using a differential digital interconnection as long as possible, taking such into consideration that it is difficult to accomplish complete impedance matching, since a plurality of electrical contacts and the different kinds of interconnection are inter-mingled in an interconnection route of the output buffer circuit 501, and that portions which can not keep a constant relation with a grounding plane (power supply plane, GND plane) are easy to be generated. Therefore, by adopting the differential digital interconnection, flexibility in the configuration of the interconnection can be increased, by expanding operational margin of amplitudes by the differential operation, and by ensuring AC loops between the differential digital interconnections. And for a general length of the interconnection in the interposer substrate 1 of from two to three centimeters, a signal interconnection of about 20 Gbps is comparatively easily established, by the differential digital interconnections of three-pole interconnections (a signal wiring, an inverted signal wiring and a ground wiring) from which digital signals are delivered.

The differential digital signals delivered from the output buffer circuit 501, are electrically connected to the interposer substrate 1 from electrode pads (not shown) through bump electrodes (not shown) or bonding wires (not shown). And further, the differential digital signals are connected to the buffer amplifier 201 of the interface IC chip 83 by the differential digital interconnections, going through buried interconnections in the inside of the interposer substrate 1, or alternatively through surface interconnections (first surface interconnections) on the top surface of the interposer substrate 1, being connected to the lead terminals 11a, 11b, . . . of the receptacle 23 and the electrical terminals 63a, 63b, 63c; 63d; . . . of the header-base 33. The buffer amplifier 201 digitally drives the VCSEL 25a so as to generate optical digital signals, corresponding to the differential digital signals received by the buffer amplifier 201. The generated optical digital signals are sent to the optical fibers 10a, 10b, 10c, . . . When the VCSEL 25a generates the optical signals corresponding to input currents, if there is a parasitic capacitance or a parasitic inductance in the interconnection between the buffer amplifier 201 and the VCSEL 25, a waveform of the current which is actually supplied to the VCSEL 25 becomes dull, and good response waveform can not be obtained, irrespective of whether the output of the buffer amplifier 201 is voltage-driven at low impedance or is current-driven at high impedance. In other words, though the outputs of the buffer amplifier 201 are digitally driven, the outputs are substantially driven by analog interconnections. Therefore, the shorter the interconnection is, the better response characteristic is obtained. On the contrary, it is not preferable to adopt electrical interconnections between the output of the buffer amplifier 201 and the VCSEL 25a, since the interconnection is susceptible to external noises and cross-talks. The similar consideration must be taken in response characteristics between a pin photodiode which serves as an optical input interface and the buffer amplifier, so it is preferable that a distance of the interconnection between the interface IC chip 83 and the optical semiconductor chip 93, should be set as short as possible. In the LSI package of the first embodiment, the interconnection between the LSI chip 5 and the interface IC chip 83, serving as an interface IC, is implemented by three-pole differential digital interconnection and the interconnection between the interface IC chip 83 and the optical semiconductor chip 93, is implemented by the analogue electrical wiring with shortest length.

When an arrangement pitch of the electrical terminals 63a, 63b, 63c, 63d, . . . of the header-base 33 of the first embodiment shown in FIG. 5, is narrow, it is difficult to establish the thermal connectors (12a), 12b, (12c), . . . interdigitally in the intervals between the lead terminals 11a, 11b, . . . , since the lead terminals 11a, 11b, . . . is arranged very close to each other. In the case, a pair of thermal connectors 121 and 122 which serve as broad plate springs, each having a plate width of 250 μm to 800 μm as shown in FIG. 13, may be used to sandwich the both ends of the lead terminals 11a, 11b, . . . so that the pair of thermal connectors 121 and 122 can contact with the both ends of the bottom surface of the interface IC chip 83 in the outside of the arrangement of the lead terminals 11a, 11b, . . . .

Figure 13:
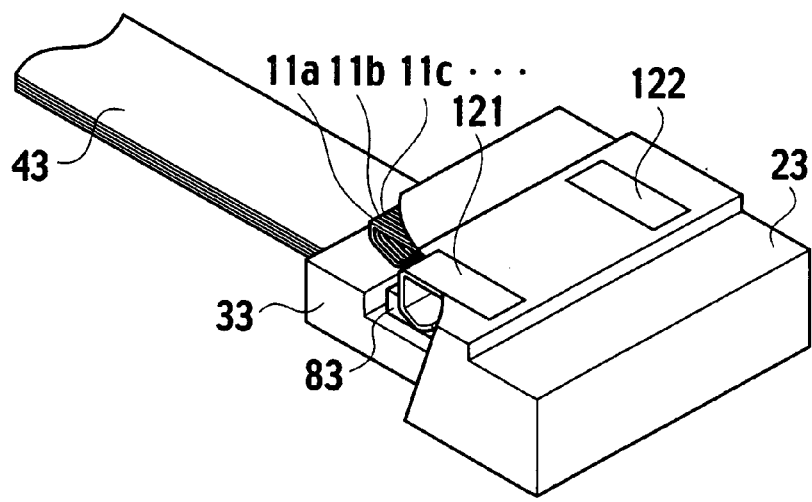
FIG. 13 is a schematic bird's eye view showing an assembled structure of a receptacle and a transmission line header, which is inserted in the receptacle, illustrating a pair of thermal connectors implemented by plate springs, contacting with the interface IC chip in the outside of the arrangement of the lead terminals.

FIG. 13 is a bird's eye view of the transmission line header implemented by the header-base 33 of the first embodiment, in which the lead terminals 11a, 11b, 11c, . . . can be seen by cutting a left end portion of the canopy (roof) of the box-shaped receptacle 23, in the assembled condition in which the transmission line header implemented by the header-base 33 is inserted under the canopy of the receptacle 23. The pair of thermal connectors 121 and 122 are disposed at the both ends of the bottom surface of the interface IC chip 83, implemented by the plate spring, so as to contact with the interface IC chip 83 in the outside of the arrangement of the lead terminals 11a, 11b, . . . .

Similarly, the other receptacles 21, 22 and 24 of FIG. 1, have the same configuration with the receptacle 23 of FIG. 13 and the other the transmission line headers implemented by the header-bodies 31, 32 and 34 of FIG. 1, have the same configuration with the transmission line header implemented by the header-base 33 shown in FIG. 13 so as to form the configuration shown in FIG. 1, in which the four the transmission line headers implemented by the header-bodies 31, 32, 33 and 34 are inserted in to the corresponding four receptacles 21, 22, 23 and 24, respectively, extending in four directions.

Figure 14:
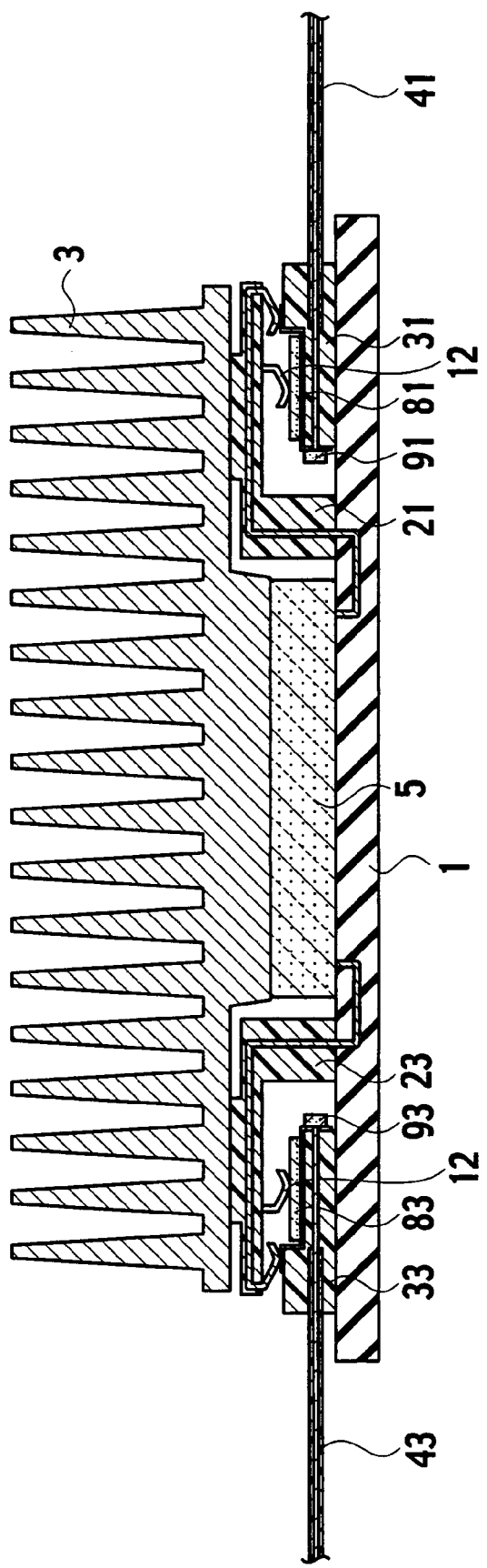
FIG. 14 is a schematic cross-sectional view of a fully assembled configuration of the LSI package, to which a heat sink is fixed, according to the first embodiment of the present invention.

Next, an assembled condition in which a heat sink 3 is fixed to a structure of the LSI package provided with the I/F module according to the first embodiment, is shown in FIG. 14. The heat sink 3 is made of aluminum (Al) and copper (Cu) as a mother material, provided with a radiating fin by a pushing molding, a caulking method and a welding process, etc. As shown in FIG. 14, it is possible to establish a level difference between the central portion and the peripheral portion on the bottom surface of the heat sink 3, when a height of the bottom surface the LSI chip 5 on which the bottom surface of the heat sink 3 is contacted at the central portion, is different friom the horizontal level of the I/F modules, or the receptacles 21 and 23 located in the peripheral portion around the LSI chip 5. Although the illustration perpendicular to the paper is omitted, the similar level differences are established between the central portion and the peripheral portion on the bottom surface of the heat sink 3, so as to adjust differences between the height of the bottom surface of LSI chip 5 at the central portion, and the height of the receptacle 22 and 24 at the peripheral portion, with respect to the symmetrical configuration shown in FIG. 1, in which the four receptacles 21, 22, 23 and 24 extend in four orthogonal directions.

In this manner, the LSI package provided with the I/F module according to the first embodiment, the level difference is established at the bottom surface of the heat sink 3 such that entire bottom surface of the heat sink 3 can contact with the bottom surface of the LSI chip 5 and with the top surfaces of receptacles 21, 22, 23 and 24 uniformly, so as to fix the heat sink 3 by using screws and retainer, etc. A heat conductive sheet may be sandwiched between on a radiating surface of the LSI chip 5, or alternatively a radiating surface of the receptacle 21, 22, 23 and 24 so as to absorb a mechanical error, or the level difference between the bottom surface of the heat sink 3 and the radiating face of the receptacles 21, 22, 23, 24 by the thickness of the heat conductive sheet. By the configuration, a thermal flow to the heat sink 3 can be ensured absorbing each of the mechanical errors by the thermal connectors (plate springs) 12, even though a thickness of the interface IC chips 81, 82, 83 and 84 on the header-bodies 31, 32, 33, and 34, namely a height of a radiating face of the header-bodies 31, 32, 33, and 34 varies.

Figure 15:
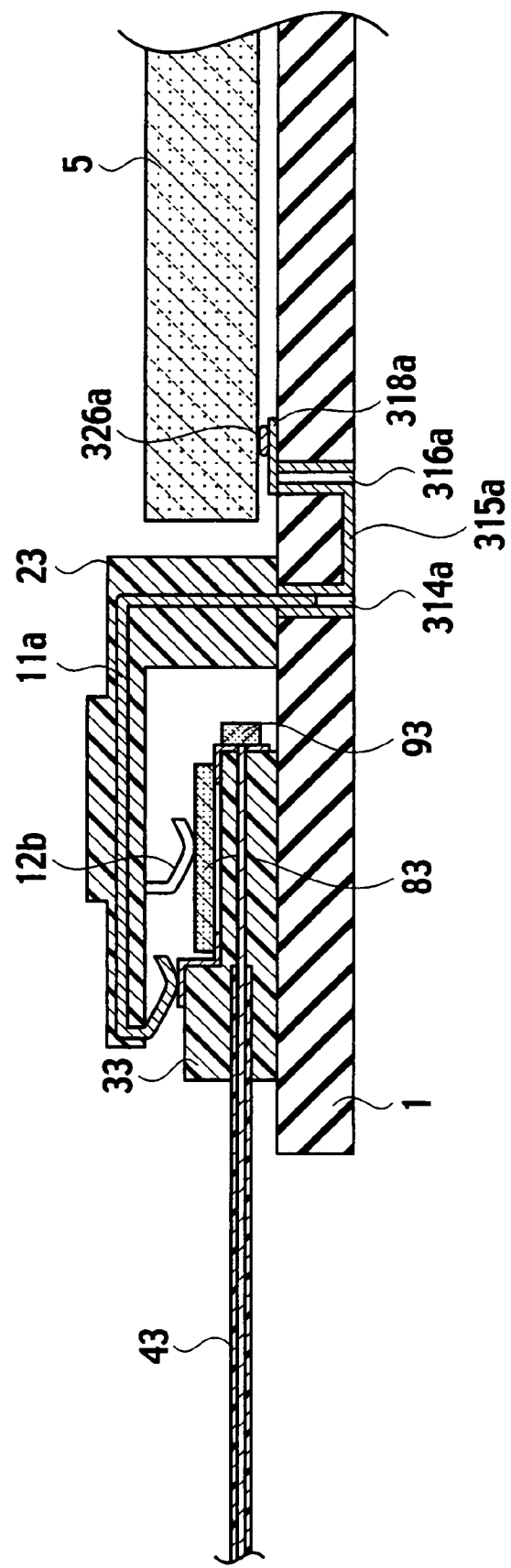
FIG. 15 is a schematic cross-sectional view illustrating an assembled structure of a receptacle and a transmission line header inserted in the receptacle, and further illustrating a configuration of a digital interconnection from the LSI chip to the receptacle.

FIG. 15 is a cross-sectional view showing a configuration of the digital interconnection from the LSI chip 5 to the receptacle 23 of the LSI package of the first embodiment. On the top surface of the LSI chip 5, a plurality of signal input-output terminals (bonding pads) are established, though the illustration is omitted. And in FIG. 15, the interposer substrate 1 forms a multi-level structure, in which alternating current grounding planes such as a GND potential distribution plane and a power-supply distribution plane are embedded, though the illustration is omitted.

In the interposer substrate 1 in which the alternating current grounding planes are embedded, high-frequency transmission lines such as a strip line and a micro-strip line can be formed so as to establish an impedance matching interconnection. However, as shown in FIG. 15, when the lead terminal 11a of substrate-inserted type is connected to the interposer substrate 1, it is necessary to form a first through-hole electrode 316a and a second through-hole electrode 314a which penetrate the interposer substrate 1 to the bottom surface (second main surface) of the interposer substrate 1, regardless of a length of the tip of the lead terminal 11a which is configured to be inserted in to the first through-hole electrode 316a or the second through-hole electrode 314a generally. This is because it is difficult to form stably the inserting hole in an arbitrary position with an arbitrary depth in the interposer substrate 1, although it is not impossible to form a blind inserting hole, the closed end of which lies in the middle level of the interposer substrate, as shown in FIG. 14. And it is also very difficult to form an electrode such as plating and paste filling in the inside of the insertion hole. Further, for instance, in a built-up substrate in which pattern isolation layers and pattern interconnection layers are laminated, it is difficult to form a through-electrode, although it is possible to form a via-electrode facilitating the connection to the middle thickness of the interposer substrate 1.

Therefore, in the LSI package of the first embodiment shown in FIG. 15, the first through-hole electrode 316a and the second through-hole electrode 314a are formed so as to implement a high-speed signal interconnection. However, if the through-hole electrode is merely used for the insertion hole of the lead terminal 11a, in other words, if a draw-around interconnection is formed on the surface of an entrance side of the second through-hole electrode 314a, superfluous capacitance is generated at a lower part of the second through-hole electrode 314a, and very large signal reflection and signal degradation are generated at the second through-hole electrode 314a. To avoid the signal reflection and signal degradation, in the LSI package of the first embodiment shown in FIG. 15, when the lead terminal 11a is inserted in to the second through-hole electrode 314a, a signal from the lead terminal 11a goes into the lower part of the second through-hole electrode 314a, and goes through a surface interconnection (second surface interconnection) 315a disposed on the bottom surface of the interposer substrate 1, the second surface interconnection 315a extends from the second through-hole electrode 314a to the first through-hole electrode 316a, and returns to the top surface of the interposer substrate 1 by the first through-hole electrode 316a.

As shown in FIG. 15, it is preferable to dispose a bump 326a implemented by a solder ball, etc. between the LSI chip 5 and a land interconnection 318a, which extends on the top surface of the interposer substrate 1 from the first through-hole electrode 316a to a location where the bump 326a is mounted, than to form directly the bump 326a just on the first through-hole electrode 316a. By the configuration of the LSI package of the first embodiment shown in FIG. 15, parasitic overload impedance associated with the electrical interconnection does not occur and good interconnection characteristics can be obtained. A joint portion around the bump 326a may be encapsulated by underfill resin. The underfill resin may be made of anisotropic conductive materials in which gold (Au), silver (Ag), nickel (Ni) or metallic powders such as titanium—nickel alloy (Ti—Ni) etc. are dispersed in insulatiug resins such as urethane resin and epoxy resin etc. The first through-hole electrode 316a and the second through-hole electrode 314a can be made of metallic plates including aluminum (Al), copper (Cu), brass (Cu—Zn), copper alloys such as Cu—Fe, Cu—Cr, Cu—Ni—Si, Cu—Sn, etc., ferronickel—alloys such as Ni—Fe, Fe—Ni—Co and composite material of copper and stainless steel, etc. In addition, these through-hole electrodes may be provided with nickel (Ni) plating and/or gold (Au) plating, etc. on these metallic materials.

By the LSI package according to the first embodiment, the interval between the interposer substrate 1 and the interface IC chip (interface IC) 83, is connected in a short-distance by using the differential digital interconnections of three-pole interconnections (a signal wiring, an inverted signal wiring and a ground wiring) which has a comparatively high immunity against impedance-mismatching, so as to ensure an impedance guarantee and to prevent an impedance discontinuity which is easy to be generated in the interval. And in the interval, the electrical terminals 63a, 63b, 63c, 63d . . . each of which can be connected to and disconnected from the corresponding lead terminals 11a, 11b, . . . , are established. And in the transmission lines where the impedance grantee is ensured, a long-distance high-speed interconnection becomes possible by waveform shaping through the interface IC chip (interface IC) 83. Or alternatively, a short-distance analogue interconnection is achieved between the interface IC chip (interface IC) 83 and the optical semiconductor chip 93, by disposing the interface IC chip (interface IC) 83 close to the optical semiconductor chip 93, which is adopted for an optical interconnection. Therefore, by the LSI package according to the first embodiment, a long-distance interconnection of high quality can be achieved in a detachable connecting system, which includes the connection by the electrical terminals 63a, 63b, 63c, 63d . . . .

In the LSI package according to the first embodiment of the present invention shown in FIGS. 1 to 15, the interposer substrate 1 can be assembled on the printed wiring board in the completely same procedure and condition as those of the LSI packaging, which is carried out by existing packaging equipment (reflow furnace, etc.), on the printed wiring board manufactured by existing production lines. And afterwards, only the process for fixing the transmission line headers implemented by the header-bodies 31 to 34 by inserting the header-bodies 31 to 34 into the receptacles 21 to 24, becomes the peculiar work for assembling the LSI package according to the first embodiment. Since the process for fixing the transmission line header implemented by the header-bodies 31 to 34 to the receptacles 21 to 24, does not need a high-precise position controlling technology (for instance, ±10 μm). That is, such position controlling accuracy for a general electrical connector is enough for the process for fixing the transmission line headers implemented by the header-bodies 31 to 34 to the receptacles 21 to 24, the cost of the assembly process of the LSI package does not increase so much. Namely, even with the existing packaging method using existing low cost printed wiring boards (for instance, glass epoxy board, etc.), a high-speed board possessing high-speed interconnections becomes possible—for instance, 20 Gbps—which generally can not be realized in an usual board electrical interconnection. According to the package of the first embodiment, it is possible to conduct reflow process, after removing the transmission lines 41, 42, 43, 44 and the header-bodies 31, 32, 33, 34 from the interposer substrate 1, in an usual manufacturing line. In addition, by making electrical connection between the interposer substrate 1 and the transmission lines 41, 42, 43, 44 through mechanical contact, position controlling accuracy with extreme high-precision is not required, which establishes comparatively simple holding mechanism. By the configuration, an investment to a new manufacturing line, in which specific instrument is prepared so that the reflow process is only possible under specific condition, becomes unnecessary. In addition, because a mechanical mechanism such as a high-precision inserting mechanism, a pressure mechanism and a holding mechanism are unnecessary for the configuration of electrical connectors, a significant cost reduction can be achieved.

Therefore, according to the LSI package of the first embodiment, interconnection between a plurality of high-speed LSI chips can be realized at a low cost, thereby facilitating the upgrading of information communication equipment, etc.

Figure 16:
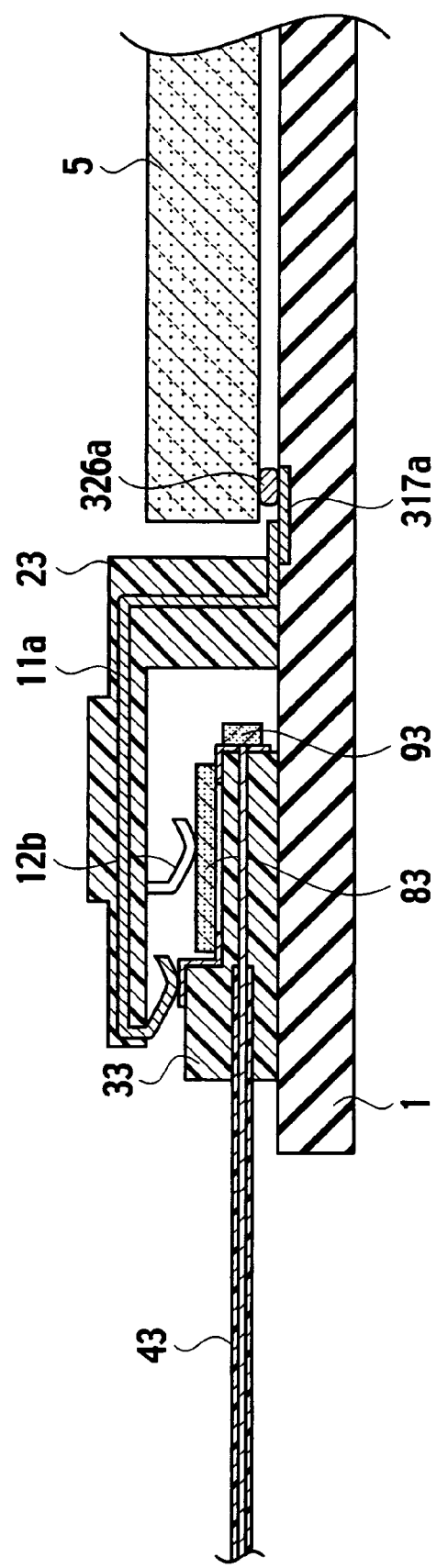
FIG. 16 is a schematic cross-sectional view illustrating an assembled structure of a receptacle and a transmission line header inserted in the receptacle, and further illustrating a high-frequency transmission line (micro-strip line) provided on the top surface of the interposer substrate in a configuration of an LSI package according to a modification of the first embodiment.

FIG. 16 shows a configuration of an LSI package according to a modification of the first embodiment, in which a surface interconnection (first surface interconnection) 317a implemented by a high-frequency transmission line such as a micro-strip line is provided on the top surface of the interposer substrate 1, so as to achieve better interconnection characteristics, without employing the first through-hole electrode 316a and the second through-hole electrode 314a shown in FIG. 15. In the LSI package according to the modification of the first embodiment shown in FIG. 16, insertion electrodes configured to mechanical hold the receptacle 23 to the interposer substrate 1, are formed separately from the first surface interconnection 317a of a high-frequency transmission line structure. Namely, among a plurality of the lead terminals 11a, 11b, . . . , the lead terminals for a signal interconnection is folded to contact with the surface electrode of the interposer, and the lead terminals adapted for an insertion electrode are inserted in to the first through-hole electrode 316a and the second through-hole electrode 314a. The lead terminals for the insertion serve as direct current terminal or signal terminals at low-speed, such as a power supply terminal, a ground terminal and a control-signal terminal.

In the LSI package according to the modification of the first embodiment shown in FIG. 16, further improvement in high-frequency characteristics is made, compared with the configuration of FIG. 15 in which signals go through the first through-hole electrode 316a and the second through-hole electrode 314a.

Second Embodiment

Figure 17:
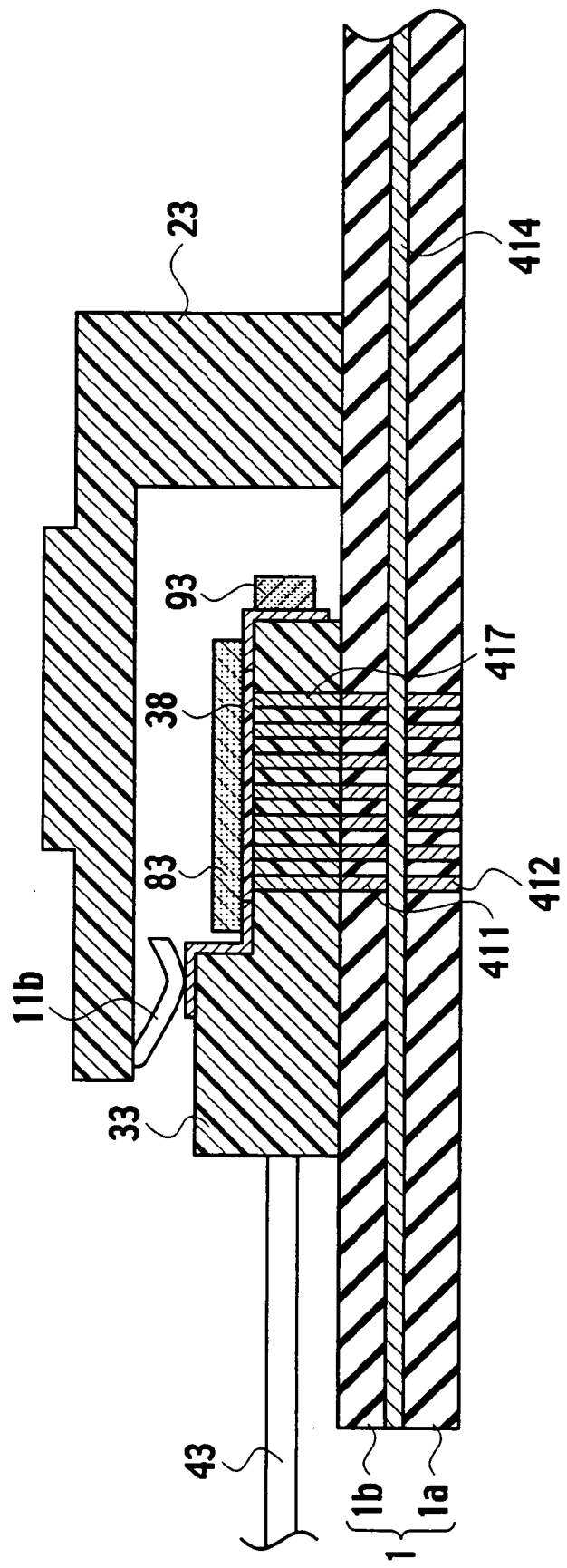
FIG. 17 is a schematic cross-sectional view illustrating an assembled structure of a receptacle and a transmission line header inserted in the receptacle, according to a second embodiment of the present invention.

As shown in FIG. 17, a configuration of an LSI package according to a second embodiment of the present invention provided with the I/F modules simplified so as to adaptable to a case in which heat radiation of the interface IC chip 83 is comparatively small, namely the generated heat is so small that enough heat can be transported away to the interposer substrate 1 and the printed wiring board (not shown). As shown in FIG. 17, a header-base 33 according to the second embodiment is similar to the header-bodies 31, 32, ... according to the first embodiment, with regard that the geometry, which is based on a concave heptahedron (L-type block) cutting part of a chip-mounting face prepared for mounting the interface IC chip 83, from a rectangular parallel-piped. However, in the header-base 33 according to the second embodiment, a plurality of thermal vias 417 are established alternately in each interval of an arrangement of the optical fibers 10a, 10b, 10c, ... along vertical direction from the chip-mounting face to the flat bottom face of the header-base 33. The plurality of thermal vias 417 are formed in the header-base 33 which is located just downward of the chip-mounting face of the interface IC chip 83. In FIG. 7, although seven thermal vias 417 are arranged in an extending direction of the optical fibers 10a, 10b, 10c, ..., the number of the thermal vias 417 is not limited to seven, and the number of the thermal vias 417 can be determined by taking the size, etc. of the interface IC chip 83 into consideration. Each of the thermal vias 417 is arranged in an array configuration in each interval of the arrangement of the optical fibers 10a, 10b, 10c, ... so as to establish heat conduction passages by filling a metal and a heat conductive paste into a through-hole extending to a vertical direction from the chip-mounting face to the flat bottom face of the header-base 33. Therefore, a heat conductive resin 38 as shown in FIG. 17, is filled into a space between a chip of the interface IC chip 83 and the chip-mounting face of the header-base 33 so as to establish the thermal connection.

Although illustrations are omitted in FIGS. 15 and 16, in the interposer substrate 1 of the LSI package according to the second embodiment, a ground plane 414 is embedded in a multi-level structure of the interposer substrate 1 as shown in FIG. 17. That is, the interposer substrate 1 of the LSI package of the second embodiment shown in FIG. 17 encompasses a first substrate 1a, the ground plane 414 on the first substrate 1a and a second substrate 1b on the ground plane 414. However the multi-level structure of the interposer substrate 1 is not limited to the configuration shown in FIG. 17. And under the thermal vias 417 of the header-base 33 of the second embodiment, upper interposer-site thermal vias 411 are formed in the second substrate 1b, or an upper part of the interposer substrate 1. The upper interposer-site thermal vias 411 are connected to the ground plane 414. The ground plane 414 is connected to lower interposer-site thermal vias 412 which are formed in the first substrate 1a, or a lower part of the interposer substrate 1. In the case, it is more effective to coat thermal grease between the header-base 33 and the interposer substrate 1.

In FIG. 17, although a single receptacle 23 and a single transmission line header implemented by the header-base 33 which is configured to be inserted in to the single receptacle 23 are shown, similar to the configuration of FIG. 1, the LSI package according to the second embodiment may encompass four receptacles 21, 22, 23, 24 and four transmission line headers implemented by the header-bodies 31, 32, 33, 34 which are configured to be inserted in to the four corresponding receptacles 21, 22, 23, 24. Namely, as similar to the configuration shown in FIG. 1, the LSI package according to the second embodiment of the present invention includes a signal processing LSI (an LSI chip; not shown), and an interposer substrate 1, on which the LSI chip is mounted, configured to be electrically connected to a printed wiring board (not shown), and a plurality of receptacles 21, 22, 23, 24, which are mounted on the interposer substrate 1. Each of the receptacles 21, 22, 23, 24 implements part of an interface mechanism between signals from/to the LSI chip and signals from/to external transmission lines. The LSI package according to the second embodiment of the present invention further includes a plurality of transmission line headers implemented by the header-bodies 31, 32, 33, and 34 each of which to be inserted in to the corresponding receptacles 21, 22, 23, and 24 respectively. On each of the header-bodies 31, 32, ..., an interface IC chip 83 is mounted. The interface IC chip 83 implements part of the interface mechanism. Each of the header-bodies 31, 32, ... establishes thermal flow from the interface IC chip 83 to the corresponding receptacles 21, 22, 23, 24. Each of the transmission line header implemented by the header-bodies 31, 32, ... is inserted in to the insides of the receptacles 21, 22, 23, 24 so that each can be detached from the receptacles 21, 22, 23, 24. In the inserted configuration, each of the transmission line header implemented by the header-bodies 31, 32, ... is electrically connected to the LSI chip 5 through the receptacles 21, 22, 23, 24. The other explanations, which are substantially overlapped with the explanations of the LSI package of the first embodiment, are omitted.

Similar to the configuration of the LSI package of the first embodiment, in the configuration of the LSI package according to the second embodiment, an interconnection from the LSI chip 5 to the interface IC chip 83 serving as an interface IC, is implemented by three-pole differential digital interconnection and an interconnection from the interface IC chip 83 to the optical semiconductor chip 93, is implemented by an analogue electrical wiring with a shortest length. Namely, by the LSI package according to the second embodiment, the interval between the interposer substrate 1 and the interface IC chip (interface IC) 83, is connected in a short-distance by using the differential digital interconnections of three-pole interconnections (a signal wiring, an inverted signal wiring and a ground wiring) which has comparatively high immunity against impedance-mismatching, so as to ensure an impedance guarantee and to prevent an impedance discontinuity which is easy to be generated in the interval. And in the interval, the electrical terminals 63a, 63b, 63c, 63d ..., each of which can be detachably connected from the corresponding lead terminals 11a, 11b, ..., are established. And in the transmission lines where the impedance grantee is ensured, a long-distance high-speed interconnection through a waveform shaping by the interface IC chip (interface IC) 83 is established. Further, a short-distance analogue interconnection is provided between the interface IC chip (interface IC) 83 and the optical semiconductor chip 93 adopted for an optical interconnection, by disposing the interface IC chip 83 close to the optical semiconductor chip 93. Therefore, by the configuration, a long-distance interconnection of high quality is achieved in a detachable connecting system, which includes the connection methodology with the electrical terminals 63a, 63b, 63c, 63d . . . .

Further, in the LSI package (LSI package provided with the I/F module) of the second embodiment of the present invention shown in FIG. 17, a topology where three aligned bundles of transmission lines are taken out along three directions or less is also possible. And if the receptacles 21, 22, 23, 24 are arranged so as to form a polygonal shape over a pentagon, a topology in which a plurality of aligned bundles of transmission lines are taken out along a plurality of directions over five directions is also possible.

By the configuration of FIG. 17, the LSI package of the second embodiment can be simplified into such architecture that the lead terminals 11a, 11b, . . . are singularly arranged in a perpendicular direction of the paper in FIG. 17, with the inside of the receptacle 23 simplified. FIG. 17 is a cross-sectional view which is formed by cutting off with a median plane placed between the optical fiber 10a, 10b, 10c, . . . A V-hook shaped tip of the lead terminal 11b is protruding downward from the roof of the receptacle 23, at rear side of the cross sectional view. In FIG. 17, further, the lead terminal 11b, 11c, 11d . . . are regularly arranged, being concealed at rear side of the paper. In the LSI package according to the second embodiment shown in FIG. 17, since the thermal connectors (12a, 12b, 12c, . . . ; 12; 121, 122) as shown in FIGS. 9 to 11 and FIGS. 13 to 16, for contacting mechanically with the interface IC chip 83 are not necessary, a trouble such as damage of the interface IC chip 83 can be resolved, so as to enhance reliability of I/F modules.

According to the package of the second embodiment, it is possible to conduct reflow process, after removing the transmission lines 41, 42, 43, 44 and the header-bodies 31, 32, 33, 34 from the interposer substrate 1, in an usual manufacturing line. In addition, by making electrical connection between the interposer substrate 1 and the transmission lines 41, 42, 43, 44 through mechanical contact, position controlling accuracy with extreme high-precision is not required, which establishes comparatively simple holding mechanism. By the configuration, an investment to a new manufacturing line, which includes a specific instrument for the reflow process under specific condition, becomes unnecessary. In addition, because a mechanical mechanism such as a high-precision inserting mechanism, a pressure mechanism and a holding mechanism are unnecessary for the configuration of electrical connectors, a significant cost reduction can be achieved.

Therefore, according to the LSI package of the second embodiment, high-speed interconnection between a plurality of high-speed LSI chips can be realized at a low cost, and the upgrading of information communication equipment, etc. can be promoted.

Third Embodiment

Figure 18:
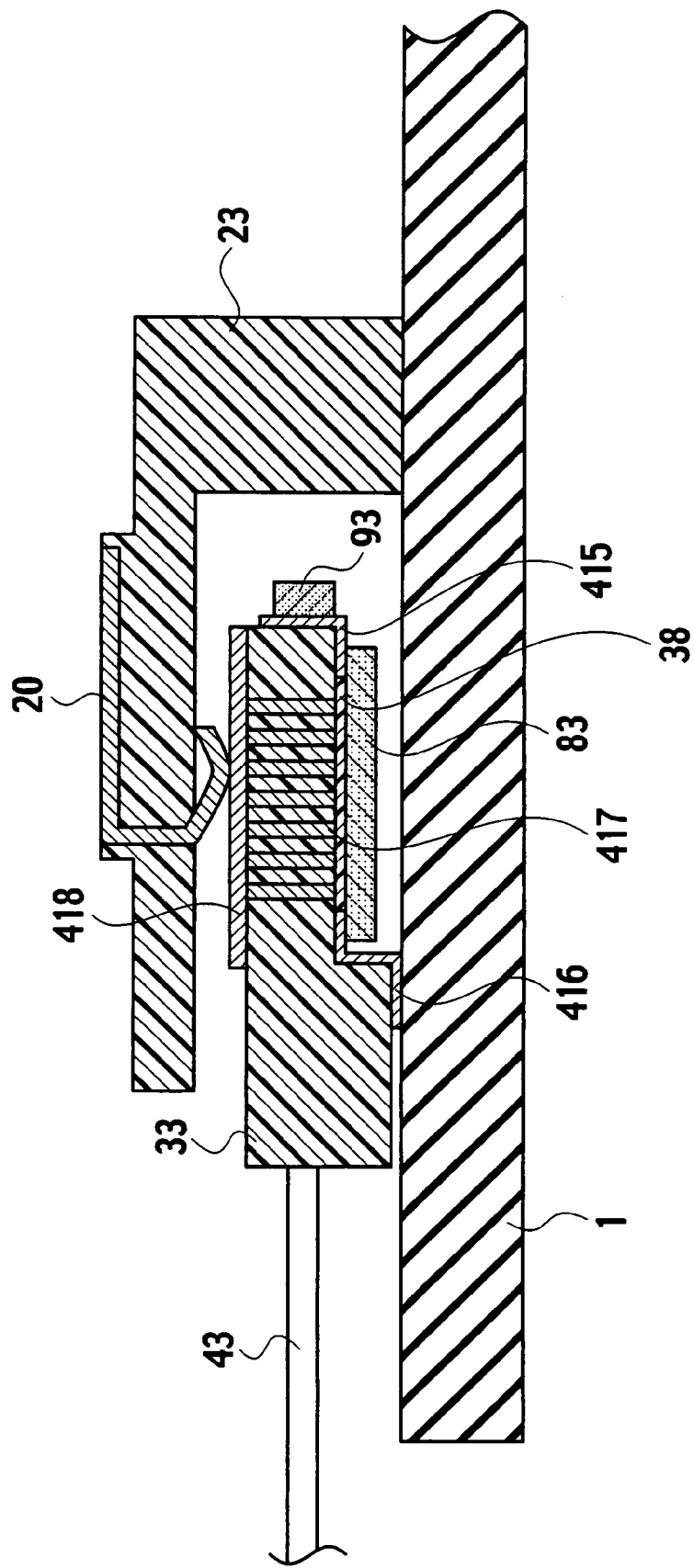
FIG. 18 is a schematic cross-sectional view illustrating an assembled structure of a receptacle and a transmission line header inserted in the receptacle, according to a third embodiment of the present invention.

As shown in FIG. 18, an LSI package according to a third embodiment of the present invention, includes a header-base 33 encompassing a topology which turns the header-base 33 of the second embodiment upside down. Namely, as shown in FIG. 18, the header-base 33 according to the third embodiment is an insulating supporting body based on a concave heptahedron (L-type block) which is formed by cutting part of the chip-mounting face prepared for mounting the interface IC chip 83, in a lower-left part of a rectangular parallel-piped. As easily understood from FIG. 18, the chip-mounting face is connected to a receptacle-contacting face disposed at the most upper level through a level difference (sidewall face) extending vertically to the receptacle-contacting face. Electrical terminals 416 extend from the chip-mounting face to the receptacle-contacting face through the level difference. The electrical terminals 416 are external-extraction electrodes for electrically connecting the header-base 33 with a packaging interconnection (not shown) which is established on the top surface of the interposer substrate 1, being extended in the inside of the receptacle 23, when the transmission line header implemented by the header-base 33 is inserted in to the receptacle 23. Further, similar to the configurations of the first and second embodiments, as shown in FIG. 18, the optical semiconductor chip 93 is mounted on a connection end face orthogonal to a plane of the chip-mounting face. And intermediate interconnections 415 are disposed in an interval between the connection end face for conceding the optical semiconductor chip 93 and the chip-mounting face. As shown in FIG. 18, it is preferable that the height of the level difference between the receptacle-contacting face and the chip-mounting face is larger than the thickness of the interface IC chip 83.

Although illustration are omitted, similar to the interconnections shown in FIGS. 2 to 5, the intermediate interconnections 415 and the electrical terminals 416 are differential digital interconnections, or the three-pole interconnections implemented by a signal wiring, an inverted signal wiring, a ground wiring, which are regularly arranged along the perpendicular direction of the paper, having a line width 40-50 μm and a space width 50-70 μm. And in the header-base 33 of the third embodiment, a plurality of thermal vias 417 are established in each interval of an arrangement of the optical fibers 10a, 10b, 10c, . . . —which are labeled collectively by reference numeral of "43" in FIG. 18—along a perpendicular direction from the chip-mounting face to an upper surface (top face) of the header-base 33. The thermal vias 417 are formed in a portion of the header-base 33, which is located above the chip-mounting face of the interface IC chip 83. In FIG. 18, although seven thermal vias 417 are arranged in an extending direction of the optical fibers 10a, 10b, 10c, . . . , the number of the thermal vias 417 is not limited to seven as well as the configuration of the second embodiment, and the number of the thermal vias 417 can be elected taking the size, etc. of the interface IC chip 83 into consideration. Each of the thermal vias 417 is arranged alternately in each interval of the arrangement of the optical fibers 10a, 10b, 10c, . . . in an array configuration so as to establish heat conduction passages, by filling a metal or a heat conductive paste into each of the through-holes extending along the perpendicular direction from the chip-mounting face to the upper surface (top surface) of the header-base 33.

And as shown in FIG. 18, on a most part of the top surface of the header-base 33, a heat plate 418 is disposed. The heat plate 418 contacts with a thermal connector (pressure spring) 20 having a broad plate width, the thermal connector (pressure spring) 20 is established in the receptacle 23. And the heat plate 418 can serve as an equalizer of thermal flow distribution of the thermal vias 417. For the material of the heat plates 418, for instance, a copper plate of 500 μm thickness coated with Ni plating layer of 500 μm thickness, or alternatively a copper plating film of 200 μm thickness coated with Ni plating layer of 20 μm thickness, is usable. Similar to the configuration of the first embodiment, the electrical terminals 416 and the intermediate interconnections 415 are delineated as a plurality of strip patterns of metallic thin films such as aluminum (Al) and copper (Cu) etc, and can be easily delineated by metallization processes with a metal mask, through which the metallic thin film is formed by sputtering or plating technique. The electrical terminals 416 and the intermediate interconnections 415 can be made of metallic thin films including copper alloys such as Cu—Fe, Cu—Cr, Cu—Ni—Si, Cu—Sn etc, ferronickel—alloys such as Ni—Fe, Fe—Ni—Co etc, and composite material of copper and stainless steel, etc. In addition, these electric interconnects may be provided by nickel (Ni) plating and/or gold (Au) plating, etc. on these metallic materials. Titanium (Ti) and platinum (Pt) are also available as an under-laying metal.

On the top surface of the interface IC chip 83 serving as the interface IC, a plurality of signal input/output terminals (bonding pads) are arranged, though the illustration was omitted. And each of the bonding pads on the top surface of the interface IC chip 83 is mutually and electrically connected to the intermediate interconnections 415 and the electrical terminals 416 through the electrical conductive bumps (not shown) respectively. Similarly the other bonding pads, which are located at rear side of the paper and near side of the paper, are also mutually and electrically connected to the corresponding intermediate interconnections 415 and the electrical terminals 416 through the other electrical conductive bumps (not shown) respectively. And, the heat conductive resin 38 as shown in FIG. 17, may be filled into a space between the chip of the interface IC chip 83 and the chip-mounting face of the header-base 33 so as to establish the thermal connection.

Similar to the architecture of the first and second embodiments, an architecture of the receptacle 23 adapted for accepting the transmission line header implemented by the header-base 33 of the third embodiment, the cross-section of which is L type, forms a box-type structure with the interposer substrate 1. One of the faces of the box, through which the transmission line header implemented by the header-base 33 to be inserted, is opened in the box-type structure. As shown in FIG. 18, a principal part of the thermal connector (pressure spring) 20, which extends perpendicular to rear side of the paper, is buried at a central portion of the roof of the receptacle 23, the roof implements the L-shaped cross section of the receptacle 23. The thermal connector 20 of a plate configuration is buried in a convex portion, which is disposed on the top surface of the roof of the receptacle 23. The convex portion extends in the direction perpendicular to the paper of FIG. 18. A V-hook shaped tip of the thermal connector 20 is protruding in the downward from the ceiling of the receptacle 23.

In the LSI package of the third embodiment shown in FIG. 18, the interface IC chip 83 contacts with packaging interconnections (not shown) which are established on the top surface of the interposer substrate 1, not through the lead terminals 11a, 11b, ... shown in FIGS. 9 to 11 and FIGS. 13 to 17 but directly through the electrical terminals 416 so as to electrically connects the interface IC chip 83 with packaging interconnections. The packaging interconnections are implemented by differential digital interconnections, or the three-pole interconnections implemented by a signal wiring, an inverted signal wiring, a ground wiring, similar to the electrical terminals 416. Therefore, the LSI package of the third embodiment can eliminates a mechanical spring mechanism shown in FIGS. 9 to 11 and FIGS. 13 to 17 for establishing electrical connection, and saves a margin of space for absorbing positioning shift caused by mechanical elastic operation. On the while, heat conduction passages from the interface IC chip 83 is made to the thermal connector (pressure spring) 20 of a plate configuration through the thermal vias 417 of the header-base 33, and is radiated from a heat spreader (not shown) adapted for thermally connecting to the thermal connector 20.

According to the configuration of the LSI package of the third embodiment shown in FIG. 18, a miniaturization of an arrangement pitch of the electrical terminals 416 can be possible. For instance, the arrangement pitch of the electrical terminals 416 is easy to be decreased below 100 μm, which facilitates high-densification of the arrangement pitch. Further, thermal resistance in the heat conduction passage is easy to decrease, compared with the configuration of the LSI package having the thermal connectors 121, 122 as shown in FIG. 13, since a width or a cross-sectional area of a heat conduction passages from the interface IC chip 83 can be taken wide.

In FIG. 18, although a single receptacle 23 and a single transmission line header implemented by the header-base 33 inserted in to the single receptacle 23 are shown, similar to the configuration of FIG. 1, the LSI package according to the third embodiment may encompass four receptacles 21, 22, 23, 24 and four transmission line headers implemented by the header-bodies 31, 32, 33, 34 which are configured to be inserted in to the four corresponding receptacles 21, 22, 23, 24. Namely, as similar to FIG. 1, the LSI package according to the third embodiment of the present invention includes a signal processing LSI (an LSI chip; not shown), and an interposer substrate 1, on which the LSI chip is mounted, configured to be electrically connected to a printed wiring board (not shown), and a plurality of receptacles 21, 22, 23, 24, which are mounted on the interposer substrate 1. Each of the receptacles 21, 22, 23, 24 implements part of an interface mechanism between signals from/to the LSI chip and signals from/to external transmission lines. The LSI package according to the third embodiment of the present invention further includes a plurality of transmission line headers implemented by the header-bodies 31, 32, 33, 34 inserted in to the corresponding receptacles 21, 22, 23, 24 respectively. On each of the header-bodies 31, 32, ... , an interface IC chip 83 is mounted. The interface IC chip 83 implements part of the interface mechanism. Each of the header-bodies 31, 32, ... establishes heat conduction passages from the interface IC chip 83 to the corresponding receptacles 21, 22, 23, 24. Each of the transmission line headers implemented by the header-bodies 31, 32, ... is inserted in to the insides of the receptacles 21, 22, 23, 24 so that each can be detached from the receptacles 21, 22, 23, 24. In the inserted configuration, each of the transmission line headers implemented by the header-bodies 31, 32, ... is electrically connected to the LSI chip 5 not through the receptacles 21, 22, 23, 24, but through contacting directly with the packaging interconnections, or the high-frequency transmission lines, which are established on the top surface of the interposer substrate 1. The other explanations which are substantially overlapped with the explanations of the LSI package of the first and second embodiments, are omitted.

Similar to the configuration of the LSI package of the first and second embodiments, in the configuration of the LSI package according to the third embodiment, an interconnection from the LSI chip 5 to the interface IC chip 83 serving as an interface IC, is implemented by three-pole differential digital interconnection and an interconnection from the interface IC chip 83 to the optical semiconductor chip 93, is implemented by an analogue electrical wiring with a shortest length. Namely, by the LSI package according to the third embodiment, the interval between the interposer substrate 1 and the interface IC chip (interface IC) 83, is connected in a short-distance by using the differential digital interconnections of three-pole interconnections, implemented by a signal wiring, an inverted signal wiring and a ground wiring, which has comparatively high immunity against impedance-mismatching, so as to ensure an impedance guarantee and to prevent an impedance discontinuity which is easy to be generated in the interval. And in the interval, the electrical terminals 416, each of which can be detachably connected from the corresponding packaging interconnections, or the high-frequency transmission lines, which are established on the top surface of the interposer substrate 1. And in the transmission lines where the impedance grantee is ensured, a long-distance high-speed interconnection through a waveform shaping by the interface IC chip (interface IC) 83 is established. Or alternatively, a short-distance analogue interconnection between the interface IC chip (interface IC) 83 and the optical semiconductor chip 93, adopted for an optical interconnection, becomes possible by disposing the interface IC chip (interface IC) 83 close to the optical semiconductor chip 93. Therefore, by the configuration, a long-distance interconnection of high quality is achieved in a detachable connecting system, which is implemented by the connection with the electrical terminals 416, can be achieved.

Further, in the LSI package (LSI package provided with the I/F module) of the third embodiment of the present invention shown in FIG. 18, a topology where three aligned bundles of transmission lines are taken out along three directions or less is also possible. And if the transmission line headers implemented by the receptacles 21, 22, 23, 24 are arranged so as to form a polygonal shape over a pentagon, a topology in which a plurality of aligned bundles of transmission lines are taken out along a plurality of directions over five directions is also possible.

According to the LSI package of the third embodiment, it is possible to conduct reflow process, after removing the transmission lines 41, 42, 43, 44 and the header-bodies 31, 32, 33, 34 from the interposer substrate 1, in an usual manufacturing line. In addition, by making electrical connection between the interposer substrate 1 and the transmission lines 41, 42, 43, 44 through mechanical contact, position controlling accuracy with extreme high-precision is not required, which establishes comparatively simple holding mechanism. By the configuration, an investment to a new manufacturing line, which includes a specific instrument for the reflow process under specific condition, becomes unnecessary. In addition, because a mechanical mechanism such as a high-precision inserting mechanism, a pressure mechanism and a holding mechanism are unnecessary for the configuration of electrical connectors, a significant cost reduction can be achieved.

Therefore, according to the LSI package of the third embodiment, high-speed interconnections between a plurality of high-speed LSI chips can be achieved at a low cost, and the upgrading of information communication equipment, etc. can be promoted.

Figure 19:
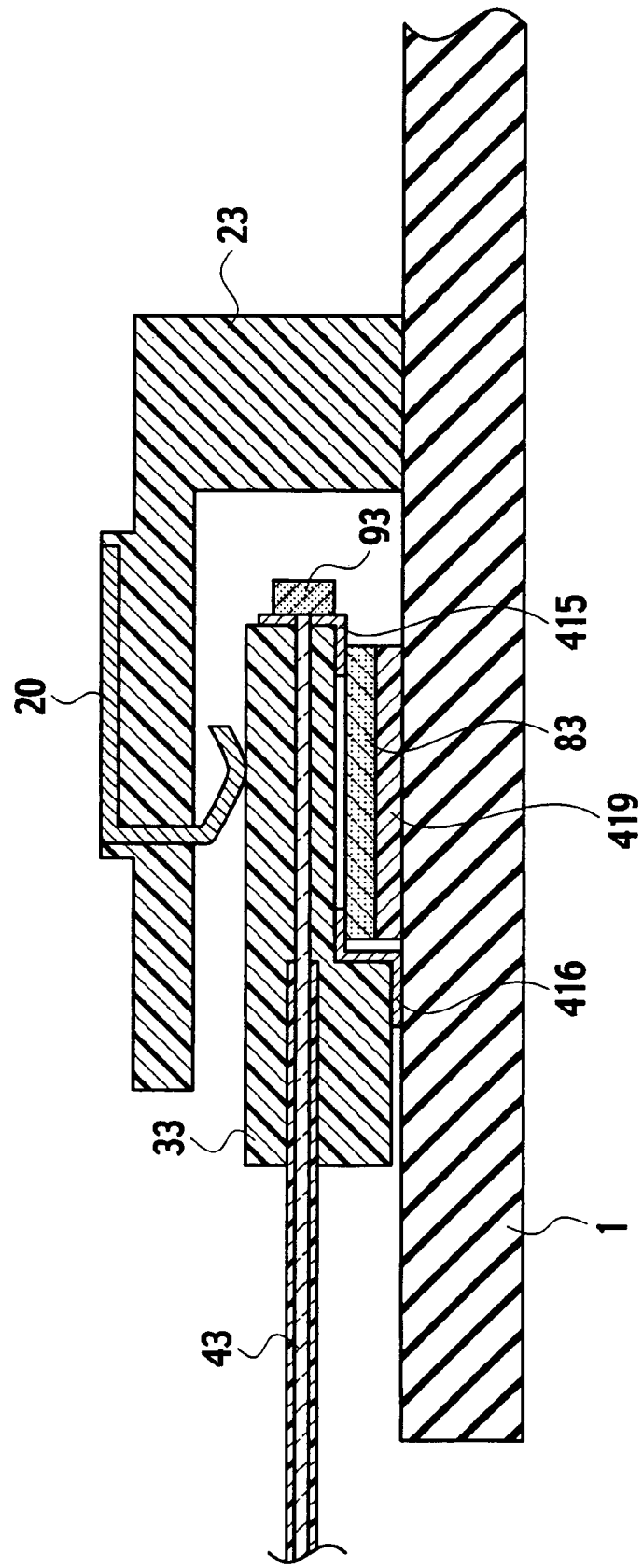
FIG. 19 is a schematic cross-sectional view illustrating an assembled structure of a receptacle and a transmission line header inserted in the receptacle, according to a modification of the third embodiment of the present invention.

FIG. 19 shows an example according to a modification of the third embodiment, adapted for a small heat radiation interface IC chip 83 of the LSI package shown in FIG. 18*l*. Namely, a configuration of an LSI package according to the modification of the third embodiment is adaptable for a case in which the interposer substrate 1 and the printed wiring board (not shown) can sufficiently serve as a heat sink for accepting the heat radiation from the interface IC chip 83. In the LSI package shown in FIG. 19, a heat conductive resin 419 is coated on the bottom surface of the interface IC chip 83 so as to facilitate a thermal connection with the interposer substrate 1. Therefore, a thermal connector (pressure spring) 20 of the modification of the third embodiment, serve as not a heat conduction passage but only a mechanical pressure spring. Accordingly, it is not necessary to provide the thermal vias 417 as shown in FIG. 18 in the transmission line header of the modification of the third embodiment, nor to provide the lead terminals 11*a*, 11*b*, . . . shown in FIGS. 9 to 11 and FIGS. 13 to 17 in the LSI package according to the modification of the third embodiment. By the configuration, it becomes possible to manufacture an LSI package with a very simple structure at a low cost. However, it is preferable to adopt a comparatively small chip for the interface IC chip 83, since the heat radiation capacity of the LSI package is comparatively small.

Fourth Embodiment

Figure 20:
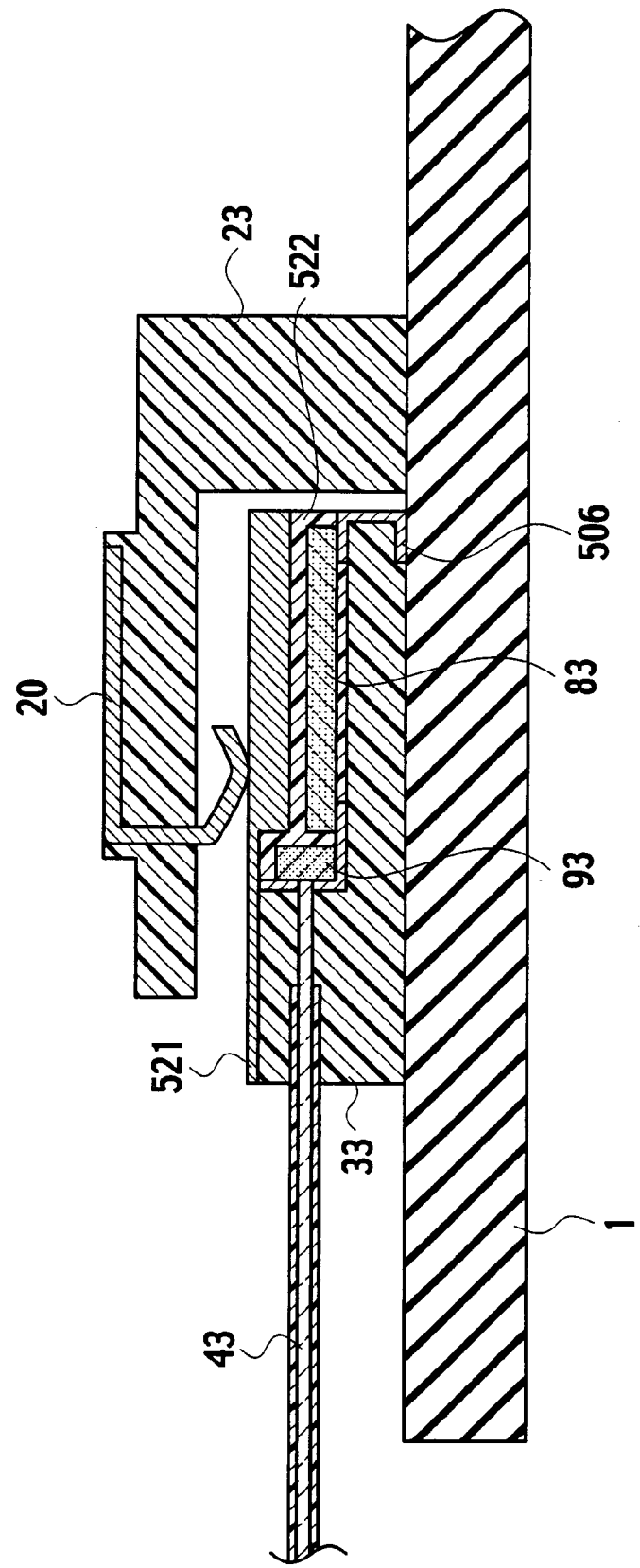
FIG. 20 is a schematic cross-sectional view illustrating an assembled structure of a receptacle and a transmission line header inserted in the receptacle, according to a fourth embodiment of the present invention.

As shown in FIG. 20, an LSI package according to a fourth embodiment of the present invention, includes a header-base 33 similar to the header-base 33 of the first and second embodiments, being formed of L-type block. As shown in FIG. 20, the header-base 33 according to the fourth embodiment is an insulating supporting body based on a concave heptahedron (L-type block) which is formed by cutting part of the chip-mounting face prepared for mounting the interface IC chip 83 in a right-upper part of a rectangular parallelpiped. However, a topology of a holding sleeves in which the optical transmission lines (optical fibers bundles) 10*a*, 10*b*, 11*c*, . . . are held and a position on which the optical semiconductor chip 93 is mounted on the header-base 33 according to the fourth embodiment, are different from the header-base 33 of the first and second embodiments.

Each shapes of the chip-mounting face, the level difference and a most upper face in the header-base 33 according to the fourth embodiment shown in FIG. 20, is a rectangle. The most upper face is disposed at the most upper level through the level difference (sidewall face) extending vertically to the most upper face. The chip-mounting face and the most upper face are opposing to the bottom face in parallel, the bottom face has an area equivalent to a total area of the chip-mounting face and the most upper face. In other words, the chip-mounting face and the bottom surface realize a thin parallel plate configuration on the right side, and the most upper face and the bottom surface realize a thick parallel plate configuration in the left. The chip-mounting face, the level difference and the most upper face are connected to the bottom surface by two L-type polygonal shapes which are disposed orthogonal to the planes of the chip-mounting face, the level difference and the most upper face. And as shown in FIG. 20, the level difference (sidewall face) of the thick parallel plate configuration, which extends vertically from the chip-mounting face to the most upper face, serves as a connection end face for connecting the optical semiconductor chip 93. A plurality of cylindrical holding sleeves are excavated so as to penetrate between the connection end face and the opposing end face, opposing to the vertical level difference (sidewall face), configured to hold the optical transmission lines (optical fibers bundles) 10*a*, 10*b*, 10*c*, . . . In FIG. 20, electrical terminals 506 are delineated in a route from the right end of the chip-mounting face to a bottom face of the L-type block, through the end face of the thin parallel plate configuration, namely a face implemented by a rectangle, four side faces of which are defined by the chip-mounting face, the bottom face and two side faces of type polygonal shape respectively. Although the electrical terminals 506 are shown collectively without a detailed illustration, the electrical terminals 506 are differential digital interconnections, or the three-pole interconnections implemented by a signal wiring, an inverted signal wiring, a ground wiring, which are regularly arranged along perpendicular direction to the paper, having a line width of 40-50 µm and a space width of 50-70 µm, as similar to the electrical interconnections shown in FIGS. 2 to 5. The electrical terminals 506 are external-extraction electrodes for electrically connecting the header-base 33 with packaging interconnections (not shown), which are delineated on the top surface of the interposer substrate 1, being extended to the inside of the receptacle 23, when the transmission line header implemented by the header-base 33 is inserted in to the receptacle 23. The packaging interconnections are implemented by the differential digital interconnections, or the three-pole interconnections implemented by a signal wiring, an inverted signal wiring, a ground wiring, similar to the electrical terminals 506.

As shown in FIG. 20, it is preferable that the height of the level difference between the most upper face and the chip-mounting face is larger than the thickness of the interface IC chip 83. The interface IC chip 83 is encapsulated by a heat conductive resin 522. The heat conductive resin 522 encapsulates the top surface of the interface IC chip 83, after the transparent resin serving as underfill resin has encapsulated the optical semiconductor chip 93. On the upper part of the heat conductive resin 522, a heat lid 521 is buried. The heat lid 521 is a L-type block having a reverse topology to the header-base 33. The heat conductive resin 522 is thermally and mechanically inserted into a space between the interface IC chip 83 and the heat lid 521. As shown in FIG. 20, the heat lid 521 is established on all face of the upper part of the header-base 33. And the top surface of the heat lid 521 and the bottom face of the header-base 33 are parallel to each other. As shown in FIG. 20, the heat lid 521 contacts with a thermal connector (pressure spring) 20 of a broad plate, established in the receptacle 23. The heat lid 521 is made of, for instance, a copper plate having 800 to 1500 µm thickness which is coated with Ni plating layer of 20 µm thickness for the thick portion of the heat lid 521, and a copper plate having 200 µm to 500 µm thickness which is coated with Ni plating layer of 20µ thickness for the thin portion of the heat lid 521.

Similar to the configuration of the first to third embodiments, the electrical terminals 506 are delineated as strip patterns of metallic thin films such as aluminum (Al) and copper (Cu) etc, and can be easily delineated by metallization processes with a metal mask, through which the metallic thin film is deposited by sputtering or plating technique. The electrical terminals 506 can be also made of metallic thin films including copper alloys such as Cu—Fe, Cu—Cr, Cu—Ni—Si, Cu—Sn etc, ferronickel—alloys such as Ni—Fe, Fe—Ni—Co etc, and composite material of copper and stainless steel, etc. In addition, these electric interconnects may be provided by nickel (Ni) plating and/or gold (Au) plating, etc. on these metallic materials. Titanium (Ti) and platinum (Pt) are also available as an under-laying metal.

On the top surface of the interface IC chip 83 serving as the interface IC, a plurality of signal input/output terminals (bonding pads) are arranged, although the illustration is omitted. And each of the bonding pads on the top surface of the interface IC chip 83 is mutually and electrically connected to the electrical terminals 506 through the electrical conductive bumps (not shown) respectively. Similarly, the other bonding pads, which are located at rear side of the paper and near side of the paper are also mutually and electrically connected to the corresponding electrical terminals 506 through the other electrical conductive bumps (not shown) respectively.

Similar to the architecture of the first to third embodiments, an architecture of the receptacle 23 adapted for accepting the transmission line header implemented by the header-base 33 of the fourth embodiment, the cross-section of which is L type, forms a box-type structure with the interposer substrate 1. One of the faces of the box, through which the transmission line header implemented by the header-base 33 to be inserted, is opened in the box-type structure. As shown in FIG. 20, a principal part of the thermal connector (pressure spring) 20, a plate extending along the perpendicular direction of the paper, is buried at a central portion of the roof of the receptacle 23, the roof implements the L-shaped cross section of the receptacle 23. The thermal connector 20 of a plate configuration is buried in a convex portion, which is disposed on the top surface of the roof of the receptacle 23. The convex portion extends in the direction perpendicular to the paper of FIG. 20. A V-hook shaped tip of the thermal connector 20 is protruding in the downward from the ceiling of the receptacle 23.

In the LSI package of the fourth embodiment shown in FIG. 20, the interface IC chip 83 contacts with packaging interconnections (not shown) delineated on the top surface of the interposer substrate 1, not through the lead terminals 11a, 11b, ... shown in FIGS. 9 to 11 and FIGS. 13 to 17 but directly through the electrical terminals 506 so as to electrically connects the interface IC chip 83 with packaging interconnections. Therefore, the LSI package of the fourth embodiment can eliminates a mechanical spring mechanism shown in FIGS. 9 to 11 and FIGS. 13 to 17 for establishing the electrical connection so as to save a margin of pattern space for absorbing positioning shift caused by mechanical elastic operation. On the while, a heat conduction passage from the interface IC chip 83 is made to the thermal connector (pressure spring) 20 of a plate configuration through the heat conductive resin 522 and the heat lid 521, and is radiated from a heat spreader (not shown) configured to be thermally connected to the thermal connector 20.

According to the configuration of the LSI package of the fourth embodiment shown in FIG. 20, a miniaturization of an arrangement pitch of the electrical terminals 506 becomes possible. For instance, the arrangement pitch of the electrical terminals 506 is easy to be decreased below 100 µm, which facilitates high-densification of the arrangement pitch. Further, thermal resistance in the heat conduction passage is easy to decrease, compared with the configuration of the LSI package which has the thermal connectors 121, 122 as shown in FIG. 13, since a width (width of cross-sectional area) of the heat conduction passage from the interface IC chip 83 can be taken wide.

As shown in FIG. 20, in the LSI package according to the fourth embodiment, the optical semiconductor chip 93, the interface IC chip 83 and the electrical terminals 506 are arranged in order, each facing to the LSI chip 5 (not shown) which is supposed to be mounted on the interposer substrate 1 being located in the right side of the configuration of FIG. 20. By the configuration, an interval between interconnections of each element can be set shortest. Further, since the interface IC chip 83 is embedded in the heat conductive resin 522 and a heat flow can be ensured through the heat lid 521, the LSI package can possess a large heat radiation capacity. Still further, the LSI package has such a configuration as equivalent to a configuration in which the optical semiconductor chip 93 and the interface IC chip 83 are encapsulated by resin in the inside of the transmission line header implemented by the header-base 33, which can increase reliability of the semiconductor chip.

Also, in the LSI package according to the fourth embodiment, the whole upper face of the header-base 33 can be used for a radiation face and it is possible to widen an effective contact area by establishing a plurality of mechanical thermal connectors. In addition, a space between a bottom part of the ceiling of the receptacle 23 and the top surface of the heat lid 521 may be filled by thermal grease.

In FIG. 20, although a single receptacle 23 and a single transmission line header implemented by the header-base 33 inserted in to the single receptacle 23 are shown, similar to the configuration of FIG. 1, the LSI package according to the fourth embodiment may encompass four receptacles 21, 22, 23, 24 and four transmission line headers implemented by the header-bodies 31, 32, 33, 34 which are configured to be inserted in to the four corresponding receptacles 21, 22, 23, 24. Namely, as similar to FIG. 1, the LSI package according to the fourth embodiment of the present invention includes a signal processing LSI (an LSI chip; not shown), and an interposer substrate 1, on which the LSI chip is mounted, configured to be electrically connected to a printed wiring board (not shown), and a plurality of receptacles 21, 22, 23, 24, which are mounted on the interposer substrate 1. Each of the receptacles 21, 22, 23, 24 implements part of an interface mechanism between signals from/to the LSI chip and signals from/to external transmission lines. The LSI package according to the fourth embodiment of the present invention further includes a plurality of transmission line headers implemented by the header-bodies 31, 32, 33, and 34 inserted in to the corresponding receptacles 21, 22, 23, and 24 respectively. On each of the header-bodies 31, 32, . . . , an interface IC chip 83 is mounted. The interface IC chip 83 implements part of the interface mechanism. Each of the header-bodies 31, 32, . . . establishes heat conduction passage from the interface IC chip 83 to the corresponding receptacles 21, 22, 23, 24. Each of the transmission line headers implemented by the header-bodies 31, 32, . . . is inserted in to the insides of the receptacles 21, 22, 23, 24 so that each can be detached from the receptacles 21, 22, 23, 24. In the inserted configuration, each of the transmission line headers implemented by the header-bodies 31, 32, . . . is electrically connected to the LSI chip 5, not through the receptacles 21, 22, 23, 24 but through contacting directly with the packaging interconnections, or the high-frequency transmission lines, which are delineated on the top surface of the interposer substrate 1. The other explanations, which are substantially overlapped with the explanations of the LSI package of the first to third embodiments, are omitted.

Further, in the LSI package of the fourth embodiment of the present invention shown in FIG. 20, a topology where three aligned bundles of transmission lines are taken out along three directions or less is also possible. And if the receptacles 21, 22, 23, 24 are arranged so as to form a polygonal shape over a pentagon, a topology in which a plurality of aligned bundles of transmission lines are taken out along a plurality of directions over five directions is also possible.

Similar to the configuration of the LSI package of the first to third embodiments, in the configuration of the LSI package according to the fourth embodiment, an interconnection from the LSI chip 5 to the interface IC chip 83 serving as an interface IC, is implemented by three-pole differential digital interconnection and an interconnection from the interface IC chip 83 to the optical semiconductor chip 93, is implemented by an analogue electrical wiring with a shortest length. Namely, by the LSI package according to the fourth embodiment, the interval between the interposer substrate 1 and the interface IC chip (interface IC) 83, is connected in a short-distance by using the differential digital interconnections of three-pole interconnections, implemented by a signal wiring, an inverted signal wiring and a ground wiring, which has comparatively high immunity against impedance-mismatching, so as to ensure an impedance guarantee and to prevent an impedance discontinuity which is easy to be generated in the interval. And in the interval, the electrical terminals 506, each of which can be detached from the corresponding packaging interconnections, or the high-frequency transmission lines, which are established on the top surface of the interposer substrate 1. And in the transmission lines where the impedance grantee is ensured, a long-distance high-speed interconnection through a waveform shaping by the interface IC chip (interface IC) 83 is established. Or alternatively, a shortdistance analogue interconnection between the interface IC chip (interface IC) 83 and the optical semiconductor chip 93, adopted for an optical interconnection, becomes possible by disposing the interface IC chip (interface IC) 83 close to the optical semiconductor chip 93. Therefore, by the configuration, a long-distance interconnection of high quality is achieved in a detachable connecting system, which includes the connection methodology with the electrical terminals 506 can be achieved. In this manner, according to the LSI package of the fourth embodiment, such LSI package (LSI provided with the I/F module) can be provided that is effective in a case in which communication speed of interconnections must be primary taken into consideration with the electrical terminals 506 having a very small arrangement pitch. The LSI package can be adaptable in a case where, for instance, the arrangement pitch of the electrical terminals 506 is below 100 μm, the communication speed of interconnections of the electrical terminals 506 is above 10 Gbps.

According to the LSI package of the fourth embodiment, it is possible to conduct reflow process, after removing the transmission lines 41, 42, 43, 44 and the header-bodies 31, 32, 33, 34 from the interposer substrate 1, in an usual manufacturing line. In addition, by making electrical connection between the interposer substrate 1 and the transmission lines 41, 42, 43, 44 through mechanical contact, position controlling accuracy with extreme high-precision is not required, which establishes comparatively simple holding mechanism. By the configuration, an investment to a new manufacturing line, which includes a specific instrument for the reflow process under specific condition, becomes unnecessary. In addition, because a mechanical mechanism such as a high-precision inserting mechanism, a pressure mechanism and a holding mechanism are unnecessary for the configuration of electrical connectors, a significant cost reduction can be achieved.

Therefore, according to the LSI package of the fourth embodiment, high-speed interconnection between a plurality of high-speed LSI chips can be achieved at a low cost, and the upgrading of information communication equipment, etc. can be promoted.

Figure 21:
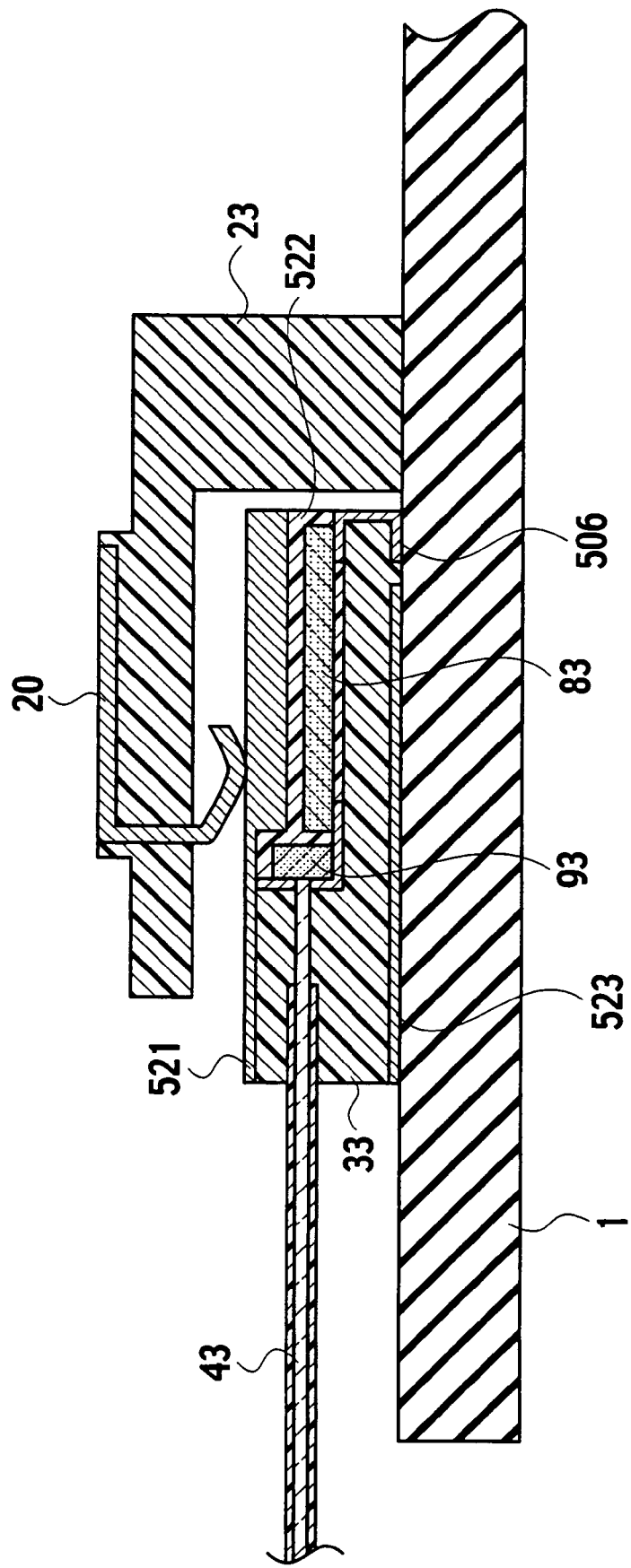
FIG. 21 is a schematic cross-sectional view illustrating an assembled structure of a receptacle and a transmission line header inserted in the receptacle, according to a modification of the fourth embodiment of the present invention.

FIG. 21 shows an example of an LSI package according to a modification of the fourth embodiment. The LSI package of the modification of the fourth embodiment includes a bottom metallic plate 523 on the bottom face of the header-base 33 formed into the L-type block. The bottom metallic plate 523 can be made of copper plating layer having a 100-500 μm thickness which is coated with a Ni plating layer of a 20 μm thickness.

Namely, as shown in FIG. 21, in the transmission line header implemented by the header-base 33 according to the modification of the fourth embodiment, the interface IC chip 83 is encapsulated by the heat conductive resin 522. On the upper part of the heat conductive resin 522, the heat lid 521 is buried. The heat lid 521 is a L-type block, having a reverse topology to the header-base 33. As shown in FIG. 21, the heat lid 521 is established on all face of the upper part of the header-base 33. And a bottom surface of the bottom metallic plate 523, which is located on the bottom face of the header-base 33, is parallel to the top surface of the heat lid 521.

By the configuration of FIG. 21 in which the bottom metallic plate 523 is established on the bottom face of the header-base 33, the generation of the internal stress ascribable to a difference in a linear expansion coefficient between the header-base 33 and the heat lid 521 is relaxed, thereby decreasing warpage strain of the header-base 33.

Other Embodiment

Figure 22:
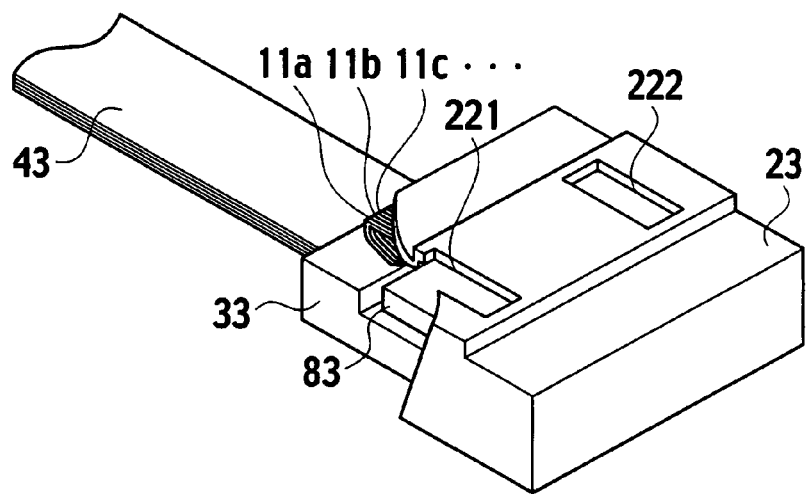
FIG. 22 is a schematic bird's eye view illustrating an assembled structure of a receptacle and a transmission line header inserted in the receptacle, according to another embodiment of the present invention.

Various modifications will become possible for those skilled in the art after receiving the teaching of the present disclosure without departing from the scope thereof. For instance, as shown in FIG. 22, the receptacle 23 may include openings 221 and 222, which are established in the same direction as the heat conduction passage of the LSI chip 5 (see to FIG. 1), so as to establish the heat radiation. FIG. 22 is a bird's eye view of the transmission line header implemented by the header-base 33 according to the other embodiment, in which the lead terminals 11a, 11b, 11c, . . . can be seen by cutting a left end portion of the roof of the L-shaped receptacle 23 which forms the box-type structure with the interposer substrate 1, in the assembled condition in which the transmission line header implemented by the header-base 33 is inserted in to the receptacle 23. A width of the openings 221 and 222 can be selected as 250-800 μm. It is preferable that the openings 221 and 222 are cut, sandwiching the arrangement of the lead terminals 11a, 11b, 11c, . . . at the both ends of the receptacle 23. A protruding portion of the heat sink for receiving a heat flow, which is disposed on the top surface of the roof of the receptacle 23, is inserted loosely or tightly into the openings 221 and 222. By the configuration, it is possible to establish heat radiation of the interface IC chip 83 from both ends of the bottom surface of the interface IC chip 83 through the openings 221 and 222. By using the configuration in which the heat radiation of the interface IC chip 83 can be established in the outside of the arrangement of the lead terminals 11a, 11b, 11c, . . . through the openings 221 and 222, it is effective in a case where an arrangement pitch of the electrical terminals 63a, 63b, 63c, 63d, . . . is narrow.

Further, the LSI chip 5 which is mounted on the interposer substrate 1, is not specially limited to the signal possessing LSI, and miscellaneous LSI chips which can operate with relation to the transmission line headers implemented by the header-bodies 31, 32, . . . serving as I/F modules can be adopted. And a shape, the material and an arrangement of the electrical terminals 63a, 63b, 63c, 63d, . . . and the lead terminals 11a, 11b, 11c, . . . are arbitrary, and therefore not limited to the above-mentioned examples of the first to fourth embodiments.

And a combination of the thermal vias 417 and the heat lid 521 may be adopted for another configuration of the header-base 33 employed in the LSI package.

Although FIG. 1 shows a configuration in which a single LSI chip 5 is mounted on the interposer substrate 1, a plurality of LSI chips can be also mounted on the interposer substrate 1. Thus, the present invention of course includes various embodiments and modifications and the like which are not detailed above. Therefore, the scope of the present invention will be defined in the following claims.

What is claimed is:

1. An LSI package mountable on a printed wiring board, comprising:
    a transmission line header comprising:
        a header-base,
        a transmission line held by the header-base, and
        an interface IC chip mounted on the header-base;
    an interposer substrate having a plurality of board-connecting joints, which facilitate connection with the printed wiring board;
    an LSI chip mounted on the interposer substrate; and
    a receptacle having a lead terminal and being mounted on the interposer substrate, configured to accommodate the transmission line header so that the interface IC chip electrically connects to the LSI chip through the lead terminal.

2. The package of claim 1, further comprising a heat sink provided on the receptacle.

3. The package of claim 1, wherein the receptacle has an opening configured to transport away thermal energy from the interface IC chip.

4. The package of claim 2, wherein thermal energy generated in the interface IC chip is transported away to the heat sink.

5. The package of claim 1, wherein the receptacle further comprises a thermal connector configured to transport away thermal energy from the interface IC chip.

6. The package of claim 5, wherein thermal energy generated in the interface IC chip is transported away to the interposer substrate through the thermal connector.

7. The package of claim 5, wherein the thermal connector is formed of thermally conductive material having elasticity.

8. The package of claim 1, wherein digital signal propagates from the LSI chip to the interface IC chip through the receptacle.

9. The package of claim 1, wherein differential digital signal propagates from the LSI chip to the interface IC chip through the receptacle.

10. The package of claim 1, wherein the transmission line comprises an optical transmission line.

11. The package of claim 10, wherein the transmission line header further comprises an optical semiconductor chip.

12. An LSI package mountable on a printed wiring board, comprising:
    an interposer substrate defined by a first main surface and a second main surface being opposite to the first main surface, having a plurality of board-connecting joints at the second main surface, which facilitate connection with the printed wiring board;
    an LSI chip mounted on a mount-area assigned in the first main surface; and
    a receptacle having a lead terminal and being mounted on the interposer substrate, configured to accommodate the transmission line header so that the interface IC chip electrically connects to the LSI chip through the lead terminal.

13. The package of claim 12, further comprising a first surface interconnection provided on the first main surface, wherein the lead terminal electrically connects to the LSI chip through the first surface interconnection.

14. The package of claim 12, further comprising:
    first and second through-hole electrodes penetrating the interposer substrate from the first main surface to the second main surface; and
    a second surface interconnection connecting the first and second through-hole electrodes at the second main surface,
    wherein the lead terminal electrically connects to the LSI chip through the second through-hole electrode, the second surface interconnection and the first through-hole electrode.

15. The package of claim 2, wherein the receptacle has a thermal connector configured to transport away thermal energy from the interface IC chip to at least one of the heat sink and the interposer substrate.

16. The package of claim 15, wherein the thermal connector is formed of thermally conductive material having elasticity.

17. The package of claim 16, wherein the transmission line header further comprises an optical semiconductor chip.

18. The package of claim 12, wherein the receptacle has a thermal connector configured to transport thermal energy away from an interface IC chip to the interposer substrate, the interface IC chip is provided in a transmission line header, and
    when the transmission line header is adapted to the receptacle, the interface IC chip and the LSI chip are electrically connected, and a heat conduction passage from the interface IC chip to the interposer substrate through the thermal connector is provided.

19. The package of claim 18, wherein the thermal connector is formed of thermally conductive material having elasticity.

20. The package of claim 18, further comprising a heat sink provided on the receptacle,
    wherein thermal energy generated in the interface IC chip is transported away through the thermal connector to at least one of the heat sink and the interposer substrate.

* * * * *